(12) United States Patent
Guizan et al.

(10) Patent No.: US 12,494,410 B2
(45) Date of Patent: Dec. 9, 2025

(54) INTEGRATED CIRCUIT DEVICE COMPRISING TUNABLE TRANSMISSION LINE USING BURIED POWER RAIL TECHNOLOGY

(71) Applicant: Intel Corporation, Santa Clara, CA (US)

(72) Inventors: Carla Moran Guizan, Munich (DE); Peter Baumgartner, Munich (DE); Richard Geiger, Munich (DE); Alexander Bechtold, Bavaria (DE); Uwe Hodel, Putzbrunn (DE); Richard Hudeczek, Munich (DE); Walther Lutz, Erding (DE); Georgios Panagopoulos, Munich (DE); Johannes Xaver Rauh, Kirchseeon (DE); Roshini Sachithanandan, Bavaria (DE)

(73) Assignee: Intel Corporation, Santa Clara, CA (US)

( * ) Notice: Subject to any disclaimer, the term of this patent is extended or adjusted under 35 U.S.C. 154(b) by 847 days.

(21) Appl. No.: 17/550,335

(22) Filed: Dec. 14, 2021

(65) Prior Publication Data

US 2023/0187313 A1   Jun. 15, 2023

(51) Int. Cl.
*H01L 23/48* (2006.01)
*H01L 23/528* (2006.01)
(Continued)

(52) U.S. Cl.
CPC ........ *H01L 23/481* (2013.01); *H01L 23/5286* (2013.01); *H01L 23/66* (2013.01); *H10D 84/834* (2025.01); *H01L 2223/6616* (2013.01)

(58) Field of Classification Search
CPC .. H01L 23/481; H01L 23/552; H01L 23/5225; H01L 23/66; H01L 23/5286; H01L 2223/6616; H10D 84/834
See application file for complete search history.

(56) References Cited

U.S. PATENT DOCUMENTS 9,628,052 B2 * 4/2017 We ................. H05K 3/4697
10,707,866 B1 * 7/2020 Liang ............... H10D 84/83
(Continued)

OTHER PUBLICATIONS

Gupta, Anshul et al "Buried Power Rail Integration with FinFETs for Ultimate CMOS Scaling", IEEE Transactions on Electron Devices, vol. 67, No. 12, Dec. 2020, pp. 54349-55354.
(Continued)

*Primary Examiner* — Khiem D Nguyen
(74) *Attorney, Agent, or Firm* — Akona IP PC

(57) ABSTRACT

IC devices including transmission lines are disclosed. An example IC device includes two electrically conductive layers (first and second layers) and a support structure between the two electrically conductive layers. The first layer is coupled to transistors over or at least partially in the support structure. A shield of a transmission is placed in the first layer. Conductors of the transmission line are placed in the second layer and are coupled to the first layer by TSVs. Another example IC device includes three electrically conductive layers (first, second, and third layers). The first layer is coupled to transistors over or at least partially in the support structure. A shield of a transmission line is placed in the second layer and conductors of the transmission line are placed in the third layer. The conductors are coupled to the first layer by TSVs and coupled to the second layer by vias.

16 Claims, 14 Drawing Sheets

(51) Int. Cl.
      *H01L 23/66*       (2006.01)
      *H10D 84/83*       (2025.01)

(56) References Cited

U.S. PATENT DOCUMENTS

| | | | |
|---|---|---|---|
| 11,107,808 B1* | 8/2021 | Or-Bach | H10D 89/105 |
| 11,121,080 B2* | 9/2021 | Sasaki | H01L 23/50 |
| 2019/0341363 A1* | 11/2019 | Yu | H01L 21/6836 |
| 2020/0211949 A1* | 7/2020 | Strong | H01L 21/561 |
| 2022/0165721 A1* | 5/2022 | Lee | H01L 24/08 |

OTHER PUBLICATIONS

Lambert, William J. et al, "Package Inductors for Intel Fully Integrated Voltage Regulators", IEEE Transactions on Components, Packaging and Manufacturing Technology, vol. 6, No. 1, Jan. 2016, pp. 3-11.

Prasad, Divya et al, "Buried Power Rails and Back-side Power Grids: Arm® CPU Power Delivery Network Design Beyond 5nm", 2019 IEEE International Electron Devices Meeting (IEDM), Dec. 7-11, 2019, pp. 19.1.1-19.1.4.

Ryckaert, J. et al, "Extending the roadmap beyond 3nm through system scaling boosters: A case study on Buried Power Rail and Backside Power Delivery", 2019 Electron Devices Technology and Manufacturing Conference (EDTM) (2019), pp. 50-52.

* cited by examiner

INTEGRATED CIRCUIT DEVICE COMPRISING TUNABLE TRANSMISSION LINE USING BURIED POWER RAIL TECHNOLOGY

TECHNICAL FIELD

This disclosure relates generally to the field of semiconductor devices, and more specifically, to integrated circuit (IC) devices.

BACKGROUND

For the past several decades, the scaling of features in ICs has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. Buried power rails (BPRs) can be a key scaling booster for complementary metal-oxide-semiconductor (CMOS) extension, e.g., beyond the 5-nm node.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
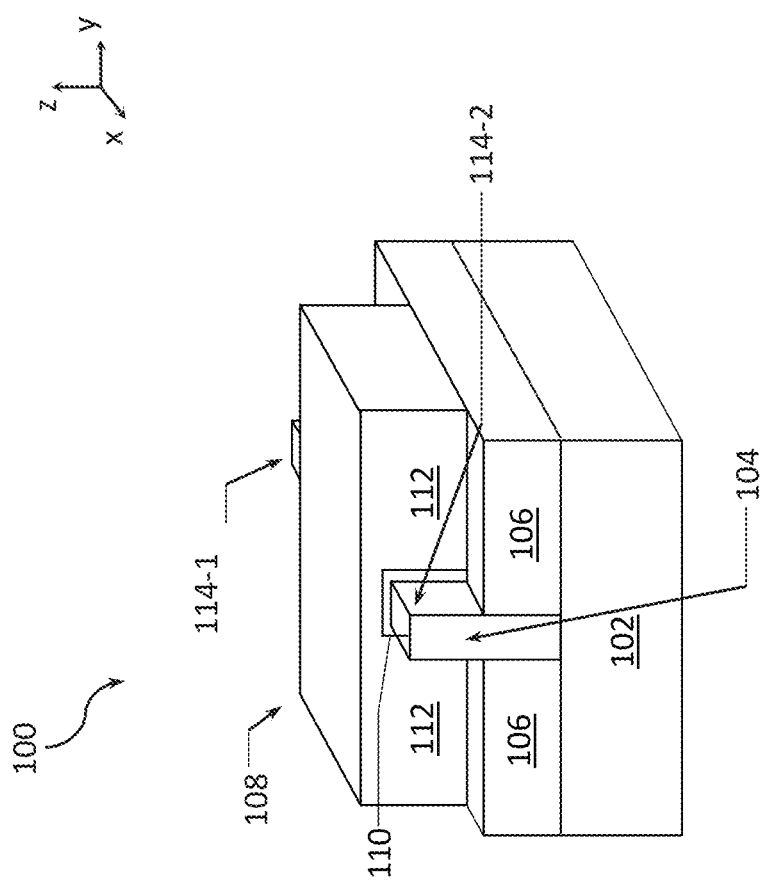
FIG. 1 is a perspective view of an example fin-based field-effect transistor (FET), or FinFET, according to some embodiments of the disclosure.

The systems, methods, and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC devices with transmission lines, proposed herein, it might be useful to first understand phenomena that may come into play in such structures. The following foundational information may be viewed as a basis from which the present disclosure may be properly explained. Such information is offered for purposes of explanation only and, accordingly, should not be construed in any way to limit the broad scope of the present disclosure and its potential applications. While some of the following descriptions may be provided for the example of transistors being implemented as FinFETs, nanoribbon-based FETs, or nanowire-based FETs, embodiments of the present disclosure are equally applicable to IC devices employing FETs of other architectures (e.g., planar FETs) as well as to IC devices employing transistors other than FETs (e.g., bipolar junction transistors).

Relentless scaling of transistors and wires in advanced semiconductor technologies has not only resulted in major process-related challenges but has also imposed severe design challenges in the sub-5 nm technology regime. Dimensional scaling of designs has been made possible by (i) Front-End-of-Line (FEOL) and Back-End-of-Line (BEOL) pitch scaling, which worsens short-channel effects in transistors and increases wire/contact resistances; and, (ii) fin depopulation in logic cells, which causes degradation of transistor drive. To enable further area scaling in sub-5 nm nodes, an approach of burying the power rails into the substrate has been proposed, which no longer requires reserving two routing tracks for power nets (e.g., VDD or VSS) in the logic cell area. Additionally, these BPRs can achieve a higher aspect ratio, thus, exhibiting lower resistance than local level BEOL power rails. BPRs can be a key scaling booster for complementary metal-oxide-semiconductor (CMOS) extension beyond the 5-nm node. Power lines which conventionally run outside substrates can be replaced with power lines "buried" within substrates, such as shallow trench isolation (STI) and Si substrate. Such power lines are called BPRs. A BPR is a power rail that is at least partially buried in a support structure, e.g., a substrate, die, etc. A BPR includes an electrically conductive material, such as metal. A rail can have an elongated structure having a longitudinal axis, which may be parallel to the frontside surface or the backside surface of the support structure. BPR frees up routing resources, which results in logic cell height reduction and overall area scaling.

Transmission lines are a common element in radio frequency (RF) and millimeter (mm)-wave IC design, e.g., for impedance matching. There have been efforts to add a tunability feature to transmission lines. One of the possible approaches is to use a slow wave transmission line, usually a coplanar waveguide (CPW) with a slotted shield. This type of transmission line has a bigger phase constant than the unshielded CPW and thus requires a shorter length. Additionally, the phase constant is different depending on whether the shield is connected to the ground of the transmission line (on state) or floating underneath (off state). Transistors can be used to control this connection and modify the characteristics of the transmission line. Unfortunately, transmission lines are usually in the BEOL metals, and the shield needs to be routed all the way down to the FEOL and substrate, impairing the performance and phase shift capability. Thus, improved technologies for transmission lines are needed.

Embodiments of the present invention relate to IC devices including transmission lines. A first example IC device includes a transmission line and a support structure inside the transmission line. The IC device also includes a first layer comprising a first electrically conductive material and a second layer comprising a second electrically conductive material. The support structure has a frontside surface and a backside surface opposing the frontside surface, which defines the frontside and backside of the IC device, respectively. The first layer is at the frontside of the support structure, the second layer is at the backside of the support structure. Conductors of the transmission line are placed in the second layer. Thus, the conductors are at the backside of the IC device. The conductors include a signal conductor and one or more ground conductors. A shield of the transmission line is placed in the first layer.

Transistors are placed over or at least partially in the support structure and are coupled to the first layer by vias. For instance, the support structure includes semiconductor structures of transistors. A gate of a transistor may be placed over the support structure, e.g., at the frontside surface of the support structure. In some embodiments, a first section of the shield is coupled to a first transistor, a second section of the shield is coupled to a second transistor, and a third section of the shield, which is between the first and second sections, is coupled to both the first and second transistors. Thus, the transistors can be used to switch the connection of the shield. In some embodiments, the transmission line is coupled to the first layer by through-substrate vias (TSVs). A TSV is a via, at least a portion of which is inside the support structure. A TSV may extend along a direction from the frontside surface of the support structure to the backside surface of the support structure. In other embodiments, the transmission line is coupled to the first layer by vias outside the support structure, rails buried in the support structure, and TSVs.

A second example IC device includes a transmission line and a support structure outside the transmission line. The second example IC device also includes a first layer, a second layer, and a third layer, each of which includes an electrically conductive material. The first layer is coupled to transistors in the support structure. A shield of the transmission line is placed in the second layer. The conductors of the transmission line are placed in the third layer. The first layer is at the frontside of the IC device. The second and third layers are at the backside of the IC device. The second layer is coupled to the first layer by at least TSVs. In some embodiments, the second layer is coupled to the first layer further by vias and rails buried in the support structure. Accordingly, the second layer, where the shield is placed, is coupled to the transistors. The transistors can control the connection of the shield.

With the BPR technology, the support structure is thinned to enable tight TSV pitches. The present invention takes advantage of the BPR technology to achieved improved performances of transmission lines. The placement of transmission line conductors at the backside enables the shield to be placed closer to transistors (or other types of active elements) and therefore, improve phase shift capability and performance of the transmission lines. As the distance between the shield and transistors is reduced, the capacitance due to routing can be mitigated and the phase shift of the transmission lines can be increased. Also, backside metal layers are usually made of lower resistance metals, e.g., compared with BEOL metals. Thus, the transmission line conductors have lower resistance. The reduced resistance can reduce the total loss in millimeter-wave products. Moreover, the tuning of transmission lines can be used to compensate for process variations, such as differences in thicknesses along the support structure or misalignment of the frontside or backside of the support structure. Therefore, these tunable transmission lines have more advantages than conventional transmission lines.

Elongated structures are mentioned throughout the present description. As used herein, a structure is referred to as an elongated if a length of the structure (measured alone one axis of an example coordinate system) is greater than both a width of the structure (measured along another axis of the example coordinate system) and a height of the structure (measured along a third axis of the example coordinate system). For example, elongated semiconductor structures as described herein may be fins or nanoribbons, having a length measured along an x-axis of the coordinate system shown in the present drawings, a width measured along a y-axis of the coordinate system shown in the present drawings, and a height measured along a z-axis of the coordinate system shown in the present drawings. Because BPRs described herein, as well as openings above them, are substantially parallel to the semiconductor structures, their lengths, widths, and heights are also measured along, respectively, an x-axis, a y-axis, and a z-axis of the x-y-z coordinate system shown in the present drawings. On the other hand, when the metal gate lines are substantially perpendicular to the semiconductor structures, as shown in the embodiments of the present drawings, their lengths, widths, and heights are measured along, respectively, a y-axis, an x-axis, and a z-axis of the x-y-z coordinate system shown.

While some of the descriptions provided herein refer to FinFETs, these descriptions are equally applicable to embodiments any other non-planar FETs besides FinFETs, e.g., to nanoribbon transistors, nanowire transistors, or transistors such as nanoribbon/nanowire transistors but having transverse cross-sections of any geometry (e.g., oval, or a polygon with rounded corners).

IC devices as described herein, in particular IC devices with including a transmission line as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials, and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, such a collection may be referred to herein without the letters.

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number of semiconductor structures, a certain number of electrically conductive layers, a certain number of BPRs, a certain number of vias, a certain number of TSVs, a certain number of transmission lines, etc.), this is simply for ease of illustration, and more, or less, than that number may be included in an IC device with at least one BPR as described herein. Still further, various views shown in some of the drawings are intended to show relative arrangements of various elements therein. In other embodiments, various IC devices with BPRs as described herein, or portions thereof, may include other elements or components that are not illustrated (e.g., transistor portions, various components that may be in electrical contact with any of the transistors, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of IC devices with BPRs as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, some descriptions may refer to a particular source or drain region or contact being either a source region/contact or a drain region/contact. However, unless specified otherwise, which region/contact of a transistor is considered to be a source region/contact and which region/contact is considered to be a drain region/contact is not important because under certain operating conditions, designations of source and drain are often interchangeable. Therefore, descriptions provided herein may use the term of a "S/D" region/contact to indicate that the region/contact can be either a source region/contact, or a drain region/contact.

In another example, if used, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials.

In another example, if used, the terms "oxide," "carbide," "nitride," etc. refer to compounds containing, respectively, oxygen, carbon, nitrogen, etc., the term "high-k dielectric"

refers to a material having a higher dielectric constant than silicon oxide, while the term "low-k dielectric" refers to a material having a lower dielectric constant than silicon oxide.

In yet another example, a term "interconnect" may be used to describe any element formed of an electrically conductive material for providing electrical connectivity to one or more components associated with an IC or/and between various such components. In general, the "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of an IC chip. Such conductive lines are typically arranged in several levels, or several layers, of metallization stacks. On the other hand, the term "conductive via" may be used to describe an electrically conductive element that interconnects two or more conductive lines of different levels of a metallization stack. To that end, a via may be provided substantially perpendicularly to the plane of an IC chip or a support structure over which an IC device is provided and may interconnect two conductive lines in adjacent levels or two conductive lines in not adjacent levels. A term "metallization stack" may be used to refer to a stack of one or more interconnects for providing connectivity to different circuit components of an IC chip.

Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Example FinFET

FIG. 1 is a perspective view of an example FinFET 100, according to some embodiments of the disclosure. The FinFET 100 illustrates one example of a transistor that can be used to control connections of shields in transmission lines. For example, the FinFET 100 may be a transistor illustrated in the IC devices shown in FIGS. 5-10. The FinFET 100 shown in FIG. 1 is intended to show relative arrangement(s) of some of the components therein. In various embodiments, the FinFET 100, or portions thereof, may include other components that are not illustrated (e.g., any further materials, such as spacer materials, surrounding the gate stack of the FinFET 100, electrical contacts to the S/D regions of the FinFET 100, etc.).

As shown in FIG. 1, the FinFET 100 may be provided over a support structure 102, where the support structure 102 may be any suitable support structure on which a transistor may be built, e.g., a substrate, a die, a wafer, or a chip. As also shown in FIG. 1, the FinFET 100 may include a fin 104, extending away from the support structure 102. A portion of the fin 104 that is closest to the support structure 102 may be enclosed by an insulator material 106, commonly referred to as an "STI material" or, simply, "STI." The portion of the fin 104 enclosed on its' sides by the STI 106 is typically referred to as a "subfin portion" or simply a "subfin." As further shown in FIG. 1, a gate stack 108 that includes at least a layer of a gate electrode material 112 and, optionally, a layer of a gate dielectric 110, may be provided over the top and sides of the remaining upper portion of the fin 104 (e.g., the portion above and not enclosed by the STI 106), thus wrapping around the upper-most portion of the fin 104. The portion of the fin 104 over which the gate stack 108 wraps around may be referred to as a "channel portion" of the fin 104 because this is where, during operation of the FinFET 100, a conductive channel may form. The channel portion of the fin 104 is a part of an active region of the fin 104. A first S/D region 114-1 and a second S/D region 114-2 (also commonly referred to as "diffusion regions") are provided on the opposite sides of the gate stack 108, forming source and drain terminals of the FinFET 100.

In general, implementations of the present disclosure may be formed or carried out on a support structure such as a semiconductor substrate, composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. In some embodiments, the substrate may be non-crystalline. In some embodiments, the support structure 102 may be a printed circuit board (PCB) substrate. Although a few examples of materials from which the substrate may be formed are described here, any material that may serve as a foundation upon which IC devices implementing signal routing using structures based on BPRs as described herein may be built falls within the spirit and scope of the present disclosure. In various embodiments, the support structure 102 may include any such substrate material that provides a suitable surface for forming the FinFET 100. The support structure 102 may, e.g., be the wafer 2000 of FIG. 11A, discussed below, and may be, or be included in, a die, e.g., the singulated die 2002 of FIG. 11B, discussed below.

As shown in FIG. 1, the fin 104 may extend away from the support structure 102 and may be substantially perpendicular to the support structure 102. The fin 104 may include one or more semiconductor materials, e.g., a stack of semiconductor materials, so that the upper-most portion of the fin (namely, the portion of the fin 104 enclosed by the gate stack 108) may serve as the channel region of the FinFET 100. Therefore, as used herein, the term "channel material" of a transistor may refer to such upper-most portion of the fin 104, or, more generally, to any portion of one or more semiconductor materials in which a conductive channel between source and drain regions may be formed during operation of a transistor.

As shown in FIG. 1, the STI material 106 may enclose the sides of the fin 104. A portion of the fin 104 enclosed by the STI 106 forms a subfin. In various embodiments, the STI material 106 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 106 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

Above the subfin portion of the fin 104, the gate stack 108 may wrap around the fin 104 as shown in FIG. 1. In particular, the gate dielectric 110 may wrap around the upper-most portion of the fin 104, and the gate electrode 112 may wrap around the gate dielectric 110. The interface between the channel portion of the fin 104 and the subfin portion of the fin 104 is located proximate to where the gate electrode 112 ends.

The gate electrode 112 may include one or more gate electrode materials, where the choice of the gate electrode materials may depend on whether the FinFET 100 is a P-type metal-oxide-semiconductor (PMOS) transistor or an N-type metal-oxide-semiconductor (NMOS) transistor. For a PMOS transistor, gate electrode materials that may be used in different portions of the gate electrode 112 may include, but are not limited to, ruthenium, palladium, platinum, cobalt, nickel, and conductive metal oxides (e.g., ruthenium oxide). For an NMOS transistor, gate electrode materials that may be used in different portions of the gate electrode 112 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 112 may include a stack of a plurality of gate electrode materials, where zero or more materials of the stack are workfunction (WF) materials and at least one material of the stack is a fill metal layer. Further materials/layers may be included next to the gate electrode 112 for other purposes, such as to act as a diffusion barrier layer or/and an adhesion layer.

If used, the gate dielectric 110 may include a stack of one or more gate dielectric materials. In some embodiments, the gate dielectric 110 may include one or more high-k dielectric materials. In various embodiments, the high-k dielectric materials of the gate dielectric 110 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 110 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 110 during manufacture of the FinFET 100 to improve the quality of the gate dielectric 110.

In some embodiments, the gate stack 108 may be surrounded by a dielectric spacer, not specifically shown in FIG. 1. The dielectric spacer may be configured to provide separation between the gate stacks 108 of different FinFETs 100 which may be provided along a single fin (e.g., different FinFETs provided along the fin 104, although FIG. 1 only illustrates one of such FinFETs), as well as between the gate stack 108 and the source/drain contacts disposed on each side of the gate stack 108. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. When such a dielectric spacer is used, then the lower portions of the fin 104, e.g., the subfin portion of the fin 104, may be surrounded by the STI material 106 which may, e.g., include any of the high-k dielectric materials described herein.

In some embodiments, the fin 104 may be composed of semiconductor material systems including, for example, N-type or P-type materials systems. In some embodiments, the fin 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the fin 104 may include a combination of semiconductor materials where one semiconductor material is used for the channel portion and another material, sometimes referred to as a "blocking material," is used for at least a portion of the subfin portion of the fin 104. In some embodiments, the subfin and the channel portions of the fin 104 are each formed of monocrystalline semiconductors, such as silicon or germanium. In a first embodiment, the subfin and the channel portion of the fin 104 are each formed of compound semiconductors with a first sub-lattice of at least one element from group III of the periodic table (e.g., Al, Ga, In), and a second sub-lattice of at least one element of group V of the periodic table (e.g., P, As, Sb). The subfin may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

For some example N-type transistor embodiments (i.e., for the embodiments where the FinFET 100 is an NMOS), the channel portion of the fin 104 may advantageously include a III-V material having a high electron mobility, such as, but not limited to InGaAs, InP, InSb, and InAs. For some such embodiments, the channel portion of the fin 104 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion of the fin 104 may be an intrinsic III-V material, i.e., a III-V semiconductor material not intentionally doped with any electrically active impurity. In alternate embodiments, a nominal impurity dopant level may be present within the channel portion of the fin 104, for example to further fine-tune a threshold voltage Vt, or to provide HALO pocket implants, etc. Even for impurity-doped embodiments however, impurity dopant level within the channel portion of the fin 104 may be relatively low, for example below $10^{15}$ dopant atoms per cubic centimeter (cm$^{-3}$), and advantageously below $10^{13}$ cm$^{-3}$. The subfin portion of the fin 104 may be a III-V material having a band offset (e.g., conduction band offset for N-type devices) from the channel portion. Example materials include, but are not limited to, GaAs, GaSb, GaAsSb, GaP, InAlAs, GaAsSb, AlAs, AlP, AlSb, and AlGaAs. In some N-type transistor embodiments of the FinFET 100 where the channel portion of the fin 104 is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 104 are each, or include, group IV semiconductors (e.g., Si, Ge, SiGe). The subfin of the fin 104 may be a first elemental semiconductor (e.g., Si or Ge) or a first SiGe alloy (e.g., having a wide bandgap).

For some example P-type transistor embodiments (i.e., for the embodiments where the FinFET 100 is a PMOS), the channel portion of the fin 104 may advantageously be a group IV material having a high hole mobility, such as, but not limited to Ge or a Ge-rich SiGe alloy. For some example embodiments, the channel portion of the fin 104 may have a Ge content between 0.6 and 0.9, and advantageously may be at least 0.7. In some embodiments with highest mobility, the channel portion may be intrinsic III-V (or IV for P-type devices) material and not intentionally doped with any electrically active impurity. In alternate embodiments, one or more a nominal impurity dopant level may be present within the channel portion of the fin 104, for example to further set a threshold voltage Vt, or to provide HALO pocket implants, etc. Even for impurity-doped embodiments however, impurity dopant level within the channel portion is relatively low, for example below $10^{15}$ cm$^{-3}$, and advantageously below $10^{13}$ cm$^{-3}$. The subfin of the fin 104 may be a group IV material having a band offset (e.g., valance band offset for P-type devices) from the channel portion. Example materials include, but are not limited to, Si or Si-rich SiGe. In some P-type transistor embodiments, the subfin of the fin 104 is Si and at least a portion of the subfin may also be doped with impurities (e.g., N-type) to a higher impurity level than the channel portion.

Turning to the first S/D region 114-1 and the second S/D region 114-2 on respective different sides of the gate stack 108, in some embodiments, the first S/D region 114-1 may be a source region and the second S/D region 114-2 may be a drain region. In other embodiments this designation of source and drain may be interchanged, i.e., the first S/D region 114-1 may be a drain region and the second S/D region 114-2 may be a source region. Although not specifically shown in FIG. 1, the FinFET 100 may further include S/D electrodes (also commonly referred to as "S/D contacts"), formed of one or more electrically conductive materials, for providing electrical connectivity to the S/D regions 114, respectively. In some embodiments, the S/D regions 114 of the FinFET 100 may be regions of doped semiconductors, e.g., regions of doped channel material of the fin 104, so as to supply charge carriers for the transistor channel. In some embodiments, the S/D regions 114 may be highly doped, e.g., with dopant concentrations of about $1 \cdot 10^{21}$ cm$^{-3}$, in order to advantageously form Ohmic contacts with the respective S/D electrodes, although these regions may also have lower dopant concentrations and may form Schottky contacts in some implementations. Irrespective of the exact doping levels, the S/D regions 114 of the FinFET 100 are the regions having dopant concentration higher than in other regions, e.g., higher than a dopant concentration in a region of the semiconductor channel material between the first S/D region 114-1 and the second S/D region 114-2, and, therefore, may be referred to as "highly doped" (HD) regions.

In some embodiments, the S/D regions 114 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the fin 104 to form the S/D regions 114. An annealing process that activates the dopants and causes them to diffuse further into the fin 104 may follow the ion implantation process. In the latter process, the one or more semiconductor materials of the fin 104 may first be etched to form recesses at the locations for the future source and drain regions. An epitaxial deposition process may then be carried out to fill the recesses with material (which may include a combination of different materials) that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. Although not specifically shown in the perspective illustration of FIG. 1, in further embodiments, one or more layers of metal and/or metal alloys may be used to form the source and drain contacts (i.e., electrical contacts to each of the S/D regions 114).

The FinFET 100 may have a gate length, GL, (i.e., a distance between the first S/D region 114-1 and the second S/D region 114-2), a dimension measured along the longitudinal axis of the fin 104, which extends in the direction of the x-axis of the example reference coordinate system x-y-z shown in the present drawings, where the gate length may, in some embodiments, be between about 5 and 40 nanometers, including all values and ranges therein (e.g. between about 22 and 35 nanometers, or between about 15 and 25 nanometers). The fin 104 may have a thickness, a dimension measured in the direction of the y-axis of the reference coordinate system x-y-z shown in FIG. 1, that may, in some embodiments, be between about 4 and 15 nanometers, including all values and ranges therein (e.g., between about 5 and 10 nanometers, or between about 7 and 12 nanometers). The fin 104 may have a height, a dimension measured in the direction of the z-axis of the reference coordinate system x-y-z shown in FIG. 1, which may, in some embodiments, be between about 30 and 350 nanometers, including all values and ranges therein (e.g., between about 30 and 200 nanometers, between about 75 and 250 nanometers, or between about 150 and 300 nanometers).

Although the fin 104 is illustrated in FIG. 1 as having a rectangular cross-section in a z-y plane of the reference coordinate system shown in FIG. 1, the fin 104 may instead have a cross-section that is rounded or sloped at the "top" of the fin 104, and the gate stack 108 (including the different portions of the gate dielectric 110) may conform to this rounded or sloped fin 104. In use, the FinFET 100 may form conducting channels on three "sides" of the channel portion of the fin 104, potentially improving performance relative to single-gate transistors (which may form conducting channels on one "side" of a channel material or substrate) and double-gate transistors (which may form conducting channels on two "sides" of a channel material or substrate). While FIG. 1 illustrates a single FinFET 100, in some embodiments, a plurality of FinFETs may be arranged next to one another (with some spacing in between) along the fin 104.

Other types of semiconductor structures can be used in a FET. For example, nanoribbon-based FETs include elongated semiconductor structures called nanoribbons as semiconductor structures. As another example, nanowire-based FETs include nanowires as semiconductor structures. As used herein, the term "nanoribbon" refers to an elongated semiconductor structure having a longitudinal axis parallel to the support structure over which a memory device is provided. Typically, a length of a such a structure (i.e., a dimension measured along the longitudinal axis, shown in the present drawings to be along the y-axis of an example x-y-z coordinate system) is greater than each of a width (i.e., a dimension measured along the x-axis of the example coordinate system shown in the present drawings) and a thickness/height (i.e., a dimension measured along the z-axis of the example coordinate system shown in the present drawings). In some settings, the terms "nanoribbon" or "nanosheet" have been used to describe elongated semiconductor structures that have a rectangular transverse cross-section (i.e., a cross-section in a plane perpendicular to the longitudinal axis of the structure), while the term "nanowire" has been used to describe similar elongated structures but with circular transverse cross-sections.

Figure 2:
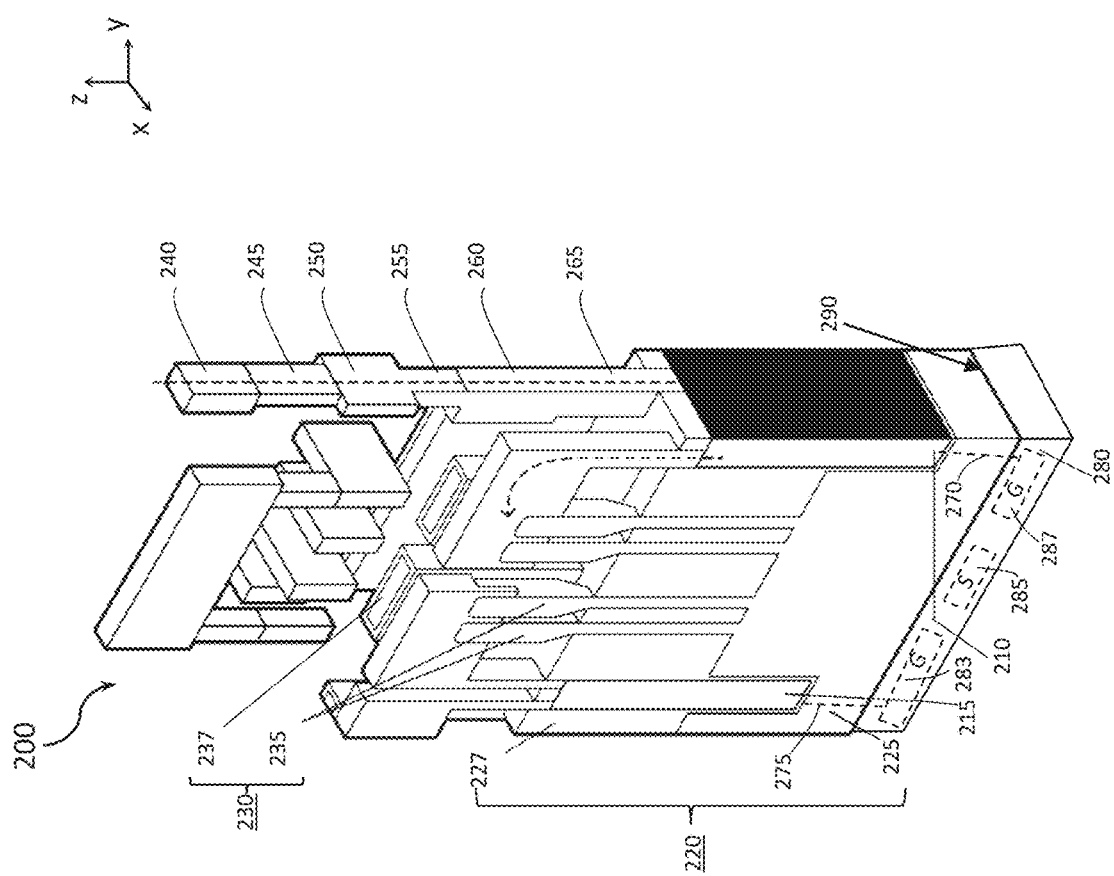
FIG. 2 is a perspective view of an example IC device including buried rails and a transmission line placed based on the buried rails, according to some embodiments of the disclosure.

FIG. 2 is a perspective view of an example IC device 200 including buried rails 210 and 215 and a transmission line placed based on the buried rails 210 and 215, according to some embodiments of the disclosure. The IC device 200 includes a support structure 220 where the buried rails 210 and 215 are buried, transistors 230 (individually referred to as "transistor 230"), electrically conductive layers 240, 250, and 260, vias 245, 255, and 265, a heat dissipation plate 270, and a backside layer 280 in which at least part of the transmission line is placed. In other embodiments, the IC device 200 may include more, fewer, or different components. In some embodiments, the components of the IC device 200 may be arranged differently. For instance, the electrically conductive layer 240 may be arranged below the support structure 220 for backside power delivery.

A transistor 230 includes semiconductor structures 235 (individually referred to as "semiconductor structure 235") and a gate 237. A semiconductor structure 235 may be a fin, nanoribbon, or nanowire of a semiconductor material. In some embodiments, at least a portion of a semiconductor structure 235 are formed in the support structure 220. The gate 237 has a first portion at least partially wrapping around a portion of a semiconductor structure 235 on a source region of the transistor 230. The gate 237 also has a second portion at least partially wrapping around a portion of another semiconductor structure 235 on a drain region of the transistor 230. An embodiment of the gate 237 is the gate stack 108 in FIGS. 1-3. A transistor 230 may be a NMOS or PMOS transistor.

The support structure 220 includes a semiconductor layer 225 and an insulator layer 227. A portion of each buried rail 210 or 215 is buried in the semiconductor layer 225, and the remaining portion of the buried rail 210 or 215 is buried in the insulator layer 227. The semiconductor layer 225 includes a semiconductor material. Examples of the semiconductor material include, for example, single crystal silicon, polycrystalline silicon, silicon-on-insulator (SOI), other suitable semiconductor material, or some combination thereof. The semiconductor layer 225 may also include other materials, such as metal, dielectric, dopant, and so on. In FIG. 2, the semiconductor layer 225 has a top surface and a bottom surface. The top surface of the semiconductor layer 225 contacts with the bottom surface of the insulator layer 227. The bottom surface of the semiconductor layer 225 is the bottom surface of the IC device 200 and can be referred to as the backside of the IC device 200. In some embodiments, the semiconductor layer 225, or a portion of it, is dopped to generate a P-type support structure or N-type support structure.

The insulator layer 227 functions as an electrical insulator that isolates conducting and semiconducting materials from each other. In some embodiments, the insulator layer 227 is an oxide layer. An example oxide layer is a layer of silicon oxide, $SiO_x$, where x is an integer number, such as 2, 2, etc. The insulator layer 227 adjoins the semiconductor layer 225. As shown in FIG. 2, the insulator layer 227 is above the semiconductor layer 225. In some embodiments, the insulator layer 427 is not a continuous insulator layer. Rather, the insulator layer 227 includes discrete insulator sections arranged in the semiconductor material of the semiconductor layer 225. The discrete insulator sections can insulate buried rails from the semiconductor material. The discrete insulator sections can also insulate semiconductor structures, which are formed in the semiconductor layer 225, of transistors from each other. The discrete insulator sections may include an oxide of the semiconductor material and can be formed from portions of the semiconductor layer 225.

In some embodiments, the insulator layer 227 may be formed by transforming a portion of a silicon support structure into silicon oxide. Silicon exposed to ambient conditions has a native oxide on its surface. The native oxide is approximately 3 nm thick at room temperature. However, 3 nm may be too thin for most applications and a thicker insulator layer needs to be grown. This is done by consuming the underlying Si to form SiOx. This is a grown layer. It is also possible to grow SiOx by a chemical vapor deposition process using Si and O precursor molecules. In this embodiment, the underlying Si in the wafer is not consumed. This is called a deposited layer. In some embodiments, the insulator layer 227 helps in protecting the components in the support structure 220 from contamination, both physical and chemical. Thus, it acts as a passivating layer. The insulator layer 227 can protect the components in the support structure 220 from scratches and it also prevents dust from interacting with the components in the support structure 220, and thus minimizes contamination. The insulator layer 227 also protects the components in the support structure 220 from chemical impurities, mainly electrically active contaminants. SiOx acts as a hard mask for doping and as an etch stop during patterning.

The buried rails 210 and 215 are electrically conductive. In some embodiments, the buried rails 210 and 215 can be used as BPRs. For instance, the buried rails 210 and 215 are coupled to one or more power sources and to semiconductor devices in the IC device 200 (such as the transistors 230) to provide power to the semiconductor devices. In FIG. 2, the two buried rails 210 and 215 are buried in the support structure 220. A portion of each buried rail 210 or 215 is buried in the insulator layer 227. The remaining portion of each buried rail 210 or 215 is buried in the semiconductor layer 225. The buried rails 210 and 215 may be made of a metal, such as tungsten (W), ruthenium (Ru), cobalt (Co), other metals, or some combination thereof. Each buried rail 210 or 215 may include a dielectric barrier on its surface that touches the semiconductor layer 225. The dielectric barrier can insulate the metal in the buried rail 210 or 215 from the semiconductor material of the semiconductor layer 225. The dielectric barrier may be an oxide barrier made from an oxide material.

The electrically conductive layers 240, 250, and 260 are built in the IC device 200 to provide power and signal to the semiconductor devices in the IC device 200. An electrically conductive layer is a layer comprising an electrically conductive material, e.g., metal. In an embodiment, the electrically conductive layers 240 and 260 are used for power delivery but the electrically conductive layer 250 is used for signal delivery. In some embodiments, the electrically conductive layer 260 is referred to as "M0," the electrically conductive layer 250 is referred to as "Mint," and the electrically conductive layer 260 is referred to as "M1," given the sequence of producing the electrically conductive layers 240, 250, and 260 in the process of fabricating the IC device 200. The electrically conductive layers 240, 250, and 260 can be made of copper or other types of metals. Each electrically conductive layer 240, 250, or 260 includes multiple sections that can be separated and insulated from each other.

The buried rails 210 and 215, electrically conductive layers 240, 250, and 260, and vias 245, 255, and 265 can constitute a conducting path for power delivery network, as indicated by the dotted line in FIG. 2. The vias 245, 255, and 265 are conducting. In one embodiment, some or all of the vias 245, 255, and 265 are made of copper or other types of metal. The vias 245 are between the electrically conductive layers 240 and 250 to couple the two electrically conductive layers 240 and 250 to each other. As shown in FIG. 2, there are three vias 245 between the electrically conductive layers 240 and 250. Each via 245 is for coupling a section of the electrically conductive layer 240 to a corresponding section of the electrically conductive layer 250. In other embodiments, there can be fewer or more vias 245 to couple the electrically conductive layers 240 and 250. Similarly, the via 255 is between the electrically conductive layers 250 and 260. The vias 265 couple the buried rails 210 and 215 to the electrically conductive layer 260. In FIG. 2, there are two vias 265 connecting the buried rail 210 to the electrically conductive layer 260 and two vias 265 connecting the buried rail 215 to the electrically conductive layer 260. The electrically conductive layer 260 is coupled to the transistors 230, particularly to semiconductor structures 235 of the transistors 230.

In an example, the electrically conductive layer 240 functions as the power plane of the IC device 200. A positive or negative voltage, for example, can be provided to the electrically conductive layer 240 so that the buried rail 210 is electrically biased. The buried rail 215 is grounded so that there is an electric potential difference between the buried rails 210 and 215, which transfers to the electric potential difference between the transistors 230. As the electrically conductive layer 240 is on top of the transistors 230, the power delivery network is called "frontside power delivery network." In other embodiments, the IC device 200 may include an electrically conductive layer below the transistors 230, e.g., at the backside of the IC device 200. The electrically conductive layer may function as the power plane, ground plane, or both to form "backside power delivery network". The buried rails 210 and 215 can be coupled to the electrically conductive layer by TSVs 270 and 275. The TSVs 270 and 275 are below the buried rails 210 and 215 and buried in the semiconductor layer 225 of the support structure 220. The TSVs may be micro-TSVs or nano-TSVs. The power delivery network of the IC device 200 can be a network of interconnect that is separate from the signal network. For instance, portions of the electrically conductive layer 250 that are not in the power delivery network can be used to deliver signals.

In the embodiment of FIG. 2, the buried rails 210 and 215 and the TSVs 270 and 275 are used to couple conductors of the transmission line, which are placed in a backside layer 280, to a shield of the transmission line, which is placed in the electrically conductive layer 260. The backside layer 280 is a layer at the backside of the support structure 220. The backside layer 280 adjoins the bottom surface 290 of the support structure 220, which defines the backside of the support structure 220. The backside layer 280 includes one or more electrically conductive layers and an insulator material that insulates the one or more electrically conductive layers from each other and from the semiconductor layer 225. As shown in FIG. 2, conductors 283, 285, and 287 of the transmission line are placed in the backside layer 280. The signal conductor 285 is between the two ground conductors 283 and 287. The transmission line also includes a shield.

In some embodiments, the shield is placed in the electrically conductive layer 260, which is at the frontside of the support structure 220. As the electrically conductive layer 260 is coupled to the semiconductor structures 235, the shield can be switched by the transistors 230. The ground conductors 283 and 287 can be coupled to the shield by the vias 265, buried rails 210 and 215, and TSVs 270 and 275. As the shield is placed in the lowest frontside electrically conductive layer (i.e., the electrically conductive layer 260), the shield is close to the transistors 230. Thus, the series resistance due to vias and routing is smaller. Also, there is small coupling to other frontside structures. Further, other higher frontside electrically conductive layers (e.g., the electrically conductive layers 240 and 250) can be placed in the IC device 200. In these embodiments, the support structure 220 is inside the transmission line and may function as dielectric at high frequencies. Also, the thickness of the support structure 220 along the z-axis can be small to achieve small TSV diameters and pitches for the purpose of achieving efficient power delivery by the buried rails 210 and 215. Thus, the conductors 283, 285, and 287 of the transmission line can be very close to the semiconductor structures 235. This results in very low losses due to the semiconductor layer 225 and enables the shield and conductors 283, 285, and 287 of the transmission line 505 be distributed to different sides of the support structure 220.

In other embodiments, the shield can be placed in an electrically conductive layer inside the backside layer 280. For instance, the shield can be between the support structure 220 and the conductors 283, 285, and 287 of the transmission line. In these embodiments, the support structure 220 is outside the transmission line. The transmission line can be better shielded from substrate effects caused by the support structure 220, compared with embodiments where the support structure 220 is inside the transmission line.

In some embodiments, the IC device 200 is fabricated through a sequence of processes. Well formation is done as the first step. The first step comprises, for example, ion implantation and dopant activation anneal. Alternatively, well formation can be done after the fin reveal step. Subsequently, fin patterning and insulator layer formation are carried out. The insulator layer formation step may include silicon oxide deposition, silicon oxide anneal, and chemical mechanical polishing (CMP). The buried rails 210 and 215 are formed in the next step, which includes patterning buried rail trench into the support structure 220. Subsequently, a dielectric barrier may be deposited onto the outer surfaces of the buried rails 210 and 215 (i.e., the surfaces touching the support structure 220) to electrically isolate the buried rails 210 and 215 from the support structure 220. In some embodiments, the step of forming the buried rails 210 and 215 may further include metal CMP and silicon oxide anneal. Next, fin reveal is carried out, e.g., by etching, to reveal the fins. After that, the electrically conductive layers 240, 250, and 260 and vias 245, 255, and 265 are integrated into the IC device 200.

Figure 3:
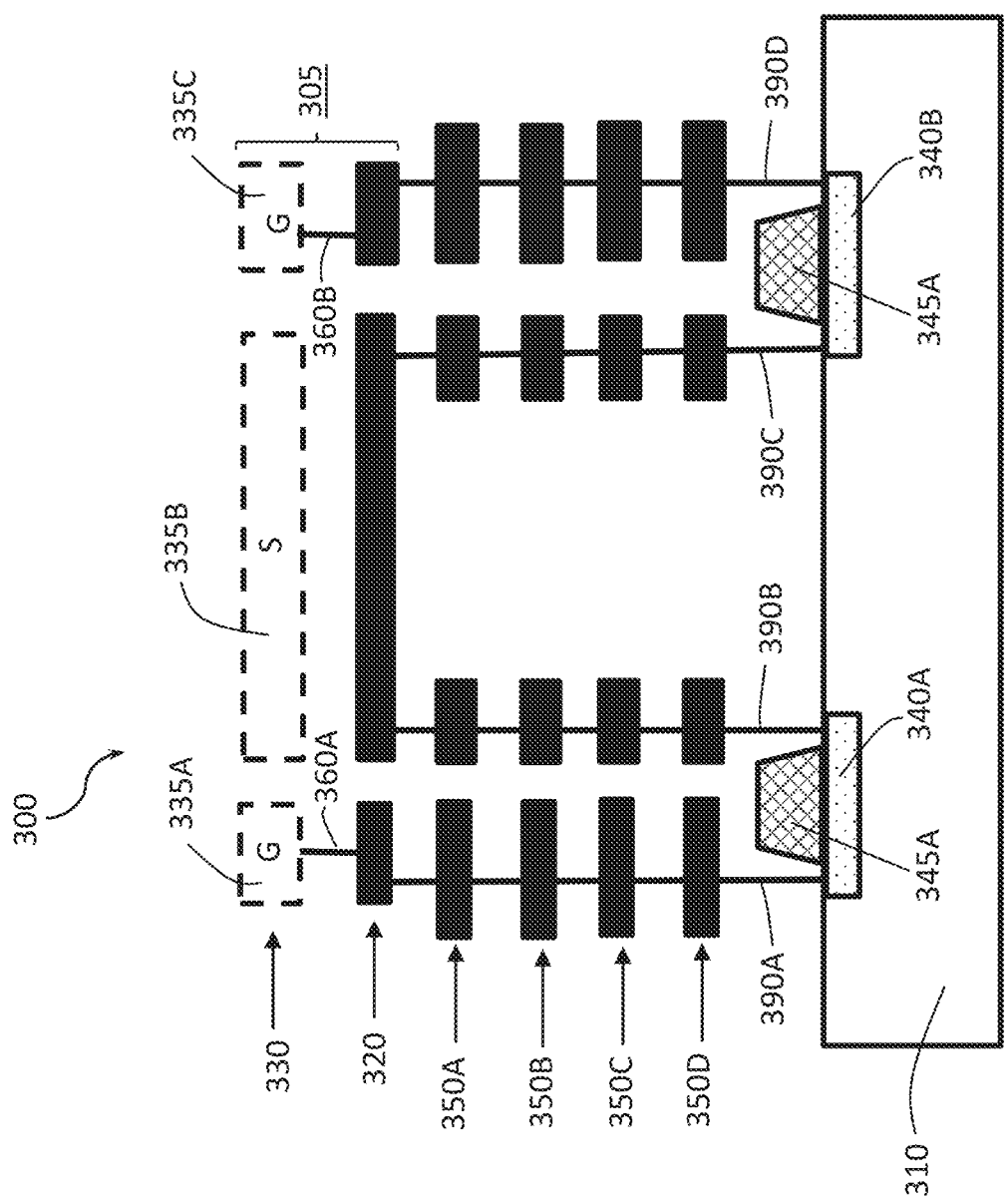
FIG. 3 is a top view of an example IC device including a tunable slow wave transmission line, according to some embodiments of the disclosure.
Figure 4:
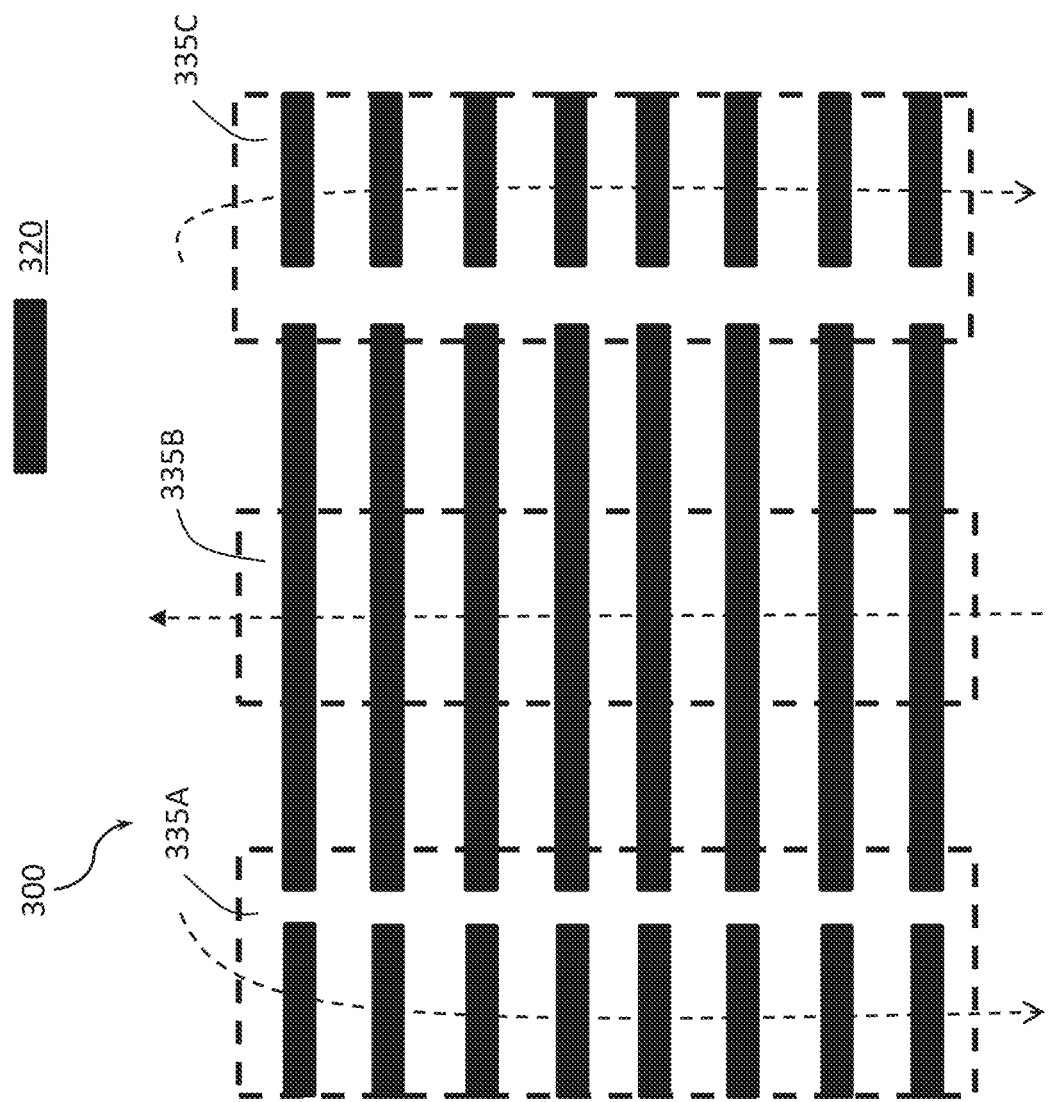
FIG. 4 is a cross-sectional view of the example IC device in FIG. 3, according to some embodiments of the disclosure.

FIG. 3 is a top view of an example IC device 300 including a tunable slow wave transmission line 305, according to some embodiments of the disclosure. FIG. 4 is a cross-sectional view of the example IC device 300 in FIG. 3, according to some embodiments of the disclosure. The IC device 300 includes a support structure 310, electrically conductive layers 320 and 330 where the transmission line is placed, semiconductor structures 340A-B (collectively referred to as "semiconductor structures 340" or "semiconductor structure 340"), and additional electrically conductive layers 350A-D (collectively referred to as "electrically conductive layers 350" or "electrically conductive layer 350"). In other embodiments, the IC device 300 may include fewer, more or different components. For instance, the IC device 300 may include more semiconductor structures 340 or more electrically conductive layers 350.

The transmission line 305 is a slow wave transmission line, which may be used in RF and mm-wave IC designs. The transmission line 305 includes a shield that is placed in the electrically conductive layer 320 and conductors 335A-C placed in the electrically conductive layer 330. In the embodiment of FIG. 3, the conductors 335A-C include a signal conductor 335B placed between two ground conductors 335A and 335C. The ground conductors 335A and 335C are coupled to the shield by vias 360A and 360B, respectively. As shown in FIG. 4, the shield is a slotted shield. The conductors 335A-C is a coplanar waveguide.

The transmission line 305 is tunable. The transmission line 305 can have a larger phase constant than the unshielded conductors 335A-C. Such a transmission line requires a shorter length. Also, the phase constant of the transmission line 305 can be different depending on whether the shield is connected to the ground of the transmission line 305 (on state) or floating underneath (off state). Transistors can control this connection and modify the characteristics of the transmission line 305. In the embodiment of FIG. 3, the shield can be switched by two transistors in the IC device 300: one transistor includes the semiconductor structure 340A and a gate 345A, the other transistor includes the semiconductor structure 340B and a gate 345B. In other embodiments, the shield can be switched by a different number of transistors. The shield is coupled to the semiconductor structures 340 by vias 390A-D and electrically conductive layers 350. As shown in FIG. 3, the vias 390A-B are connected to the semiconductor structure 340A and the vias 390C-D are connected to the semiconductor structure 340B. However, due to the presence of the electrically conductive layers 350 and insulator material between the electrically conductive layers 350, the shield is distant from the transistors. This can decrease the performance and phase shift capability. This problem can be mitigated by reducing the distance between the shield and the transistors, which can be achieved by using backside conductors, i.e., conductors placed at the backside of support structures. More details regarding transmission lines including backside conductors are provided below in conjunction with FIGS. 5-10.

Figure 5:
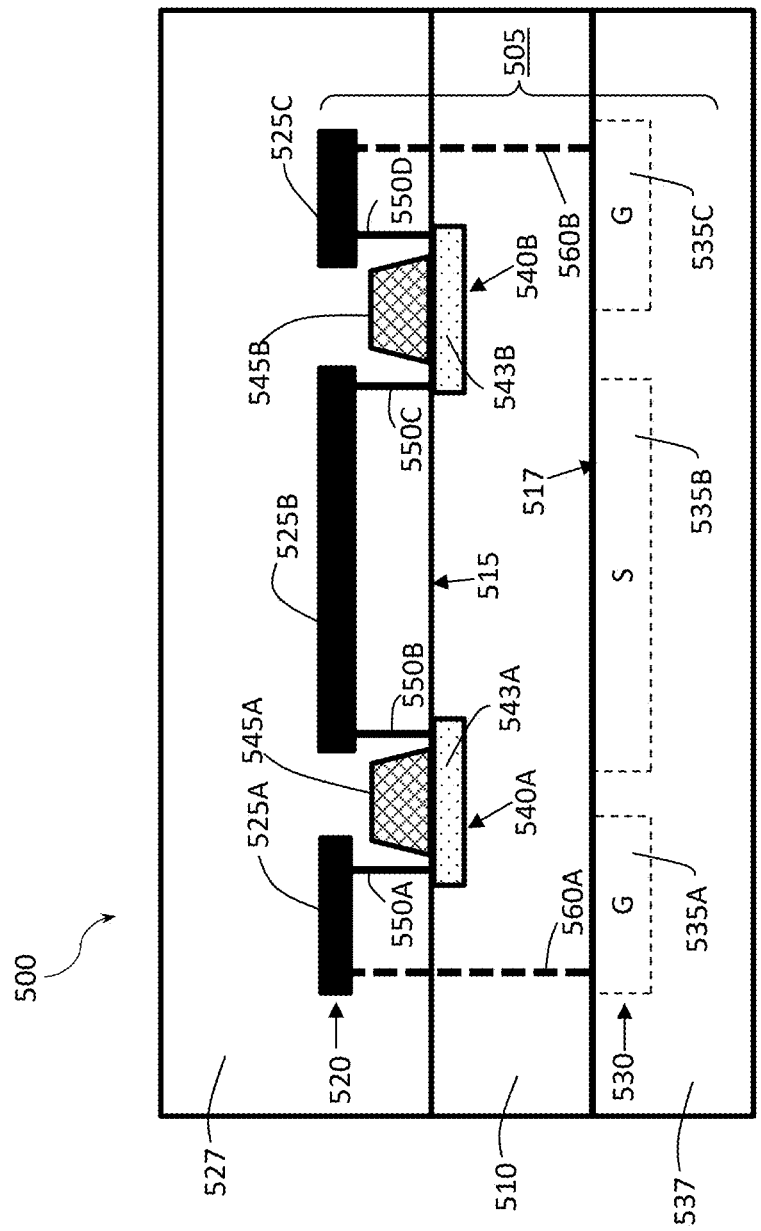
FIG. 5 is a cross-sectional view of an example IC device including a transmission line and a support structure inside the transmission line, according to some embodiments of the disclosure.

FIG. 5 is a cross-sectional view of an example IC device 500 including a transmission line 505 and a support structure 510 inside the transmission line 505, according to some embodiments of the disclosure. The IC device 500 further includes electrically conductive layers 520 and 530 and transistors 540A-B. In other embodiments, the IC device 500 may include different components.

The support structure 510 is a layer comprising a semiconductor material, such as silicon. The support structure 510 facilitates formation of the transistors 540A-B collectively referred to as "transistors 540" or "transistor 540"). The support structure 510 includes two semiconductor structures 543A and 543B (collectively referred to as "semiconductor structures 543" or "semiconductor structure 543"). A semiconductor structure 543 may be a fin, nanoribbon, or nanowire of a semiconductor material, such as silicon. A semiconductor structure 543 may be a NMOS or PMOS. The two semiconductor structures 543 may be the same or different. In some embodiments, a semiconductor structure 543 is formed by doping a section of the support structure 510. The semiconductor structure 543A is connected to a gate 545A. The semiconductor structure 543A and gate 545A constitutes the transistor 540A. Similarly, the semiconductor structure 543B and gate 545B constitutes the transistor 540B. In other embodiments, the support structure 510 may include other semiconductor structures of other transistors. The gates 545A-B are over the support structure 510.

The support structure 510 includes two surfaces 515 and 517. The surface 517 opposes the surface 515. The semiconductor structures 543 are at the surface 515. The surface 515 can be the frontside surface of the support structure 510. The side of the support structure 510 from the surface 515 upwards is referred to as the frontside of the support structure 510 and the frontside of the IC device 500. The surface 517 can be the backside surface of the support structure 510. The side of the support structure 510 from the surface 517 downwards is referred to as the backside. Electrically conductive layers may be arranged in the frontside and backside of the support structure 510. In the embodiment of FIG. 5, the electrically conductive layer 520 is the first frontside electrically conductive layer (i.e., the first electrically conductive layer from the surface 515 and the lowest frontside electrically conductive layer) and the electrically conductive layer 530 is the first backside electrically conductive layer (i.e., the first electrically conductive layer from the surface 517 and the highest backside electrically conductive layer). The electrically conductive layer 520 is closer to the surface 515 than the surface 517. The electrically conductive layer 530 is closer to the surface 517 than the surface 515. In other embodiments, the IC device 500 may include other electrically conductive layers, e.g., electrically conductive layers arranged in parallel to the electrically conductive layer 520 or 530.

The electrically conductive layer 520 is a layer comprising an electrically conductive material, e.g., metal. A shield of the transmission line 505 is placed in the electrically conductive layer 520. The electrically conductive layer 520 include sections 525A, 525B, and 525C (collectively referred to as "sections 525" or "section 525"). The sections 525 are insulated from each other. For instance, the electrically conductive layer 520 is enclosed in an insulator layer 527. The insulator layer 527 is a layer comprising an electrical insulator, such as an oxide material. The electrical insulator separates and insulates the sections 525 from each other.

The semiconductor structures 543 are coupled to the electrically conductive layer 520 through vias 550A-D (collectively referred to as "vias 550" or "via 550"). As shown in FIG. 5, the semiconductor structure 543A is coupled to the sections 525A and 525B of the electrically conductive layer 520 through two vias 550A-B. The semiconductor structure 543B is coupled to the sections 525B and 525C of the electrically conductive layer 520 through another two vias 550C-D. A shield of the transmission line 505 is placed in the electrically conductive layer 520. Accordingly, the shield is coupled to the semiconductor structures 543 of the transistors 540 by the vias 550 and the transistors 540 can switch the connection of the shield, i.e., connection of the sections 525 of the electrically conductive layer 520. The transmission line 505 may be a switched slow wave transmission line. In other embodiments, the transmission line 505 may be other types of transmission lines, such as slow wave transmission lines without switches (e.g., the shield of the transmission line 505 is not coupled to the semiconductor structures 543), microstrip transmission lines, coplanar waveguide transmission lines, and so on.

The electrically conductive layer 530 is another layer comprising an electrically conductive material, e.g., metal. The electrically conductive layer 530 may include the same electrically conductive material as, or different electrically conductive material from, the electrically conductive layer 520. The electrically conductive layer 530 includes sections 535A, 535B, and 535C (collectively referred to as "sections 535" or "section 535"). The sections 535 are insulated from each other. For instance, the electrically conductive layer 520 is enclosed in an insulator layer 537. The insulator layer 537 is a layer comprising an electrical insulator, such as oxide. The electrical insulator separates and insulates the sections 535 from each other.

Conductors of the transmission line 505 are placed in the electrically conductive layer 530. In an embodiment, a first ground conductor of the transmission line 505 is placed in the section 535A of the electrically conductive layer 530, a signal conductor of the transmission line 505 is placed in the section 535B, and a second ground conductor is placed in the section 535C. The ground conductors of the transmission line 505 are coupled to the electrically conductive layer 520 by TSVs 560A-B. As shown in FIG. 5, the ground conductor placed in the section 535A of the electrically conductive layer 530 is coupled to the section 525A of the electrically conductive layer 520 by the TSV 560A. The ground conductor placed in the section 535C of the electrically conductive layer 530 is coupled to the section 525C of the electrically conductive layer 520 by the TSV 560B. The signal conductor placed in the section 535B is separated and insulated from the electrically conductive layer 520.

As the shield is placed in the lowest frontside electrically conductive layer (i.e., the electrically conductive layer 520), the shield is closer to the switching transistors, compared with the shield in the embodiment of FIG. 3. Thus, the series resistance due to vias and routing is smaller. Also, there is small coupling to other frontside structures. Further, other higher frontside electrically conductive layers can be placed in the IC device 500 and available for routing.

In some embodiments, the thickness of the electrically conductive layer 530 is larger than the thickness of the electrically conductive layer 520. A thicker electrically conductive layer has less resistance. This can result in lower attenuation and better performance of the transmission line 505. In the embodiment of FIG. 5, the electrically conductive layer 530 is the closest electrically conductive layer to the support structure 510 in the backside. The thick metals on this side have less resistance.

In some embodiments, the support structure 510 functions as dielectric at high frequencies, such as frequencies above the cutoff frequency $f_c = \frac{1}{2}\pi\rho\epsilon$, where $f_c$ is the cutoff frequency, $\pi$ is a mathematical constant approximately equal to 3.14159, and $\epsilon$ is the permittivity of the semiconductor material in the support structure 510. The high epsilon results in a large capacitance between the shield at the frontside and the conductors at the backside, which is beneficial for switching the shield. Also, attenuation may be larger at frequencies below the cutoff frequency, which can be used to filter out lower frequencies.

As the support structure 510 is between the electrically conductive layer 520 and electrically conductive layer 530, the shield and conductors are on opposite sides of the support structure 510 and the support structure 510 is inside the transmission line 505. Such configuration of the transmission line 505 is enabled by the BPR technology. With the BPR technology, the support structure 510 can be very thin, such as around 0.5 um. The BPR technology uses such support structure to be able to achieve small TSV diameters and pitches. Thus, the conductors of the transmission line 505 can be very close to the semiconductor structures 543. This results in very low losses due to the semiconductor layer (e.g., the support structure 510) and enables the configuration of the transmission line in FIG. 5, where the shield and conductors of the transmission line 505 are distributed to different sides of the support structure 510. The BPRs can be buried in the support structure 510 and be used for frontside or backside power delivery.

Figure 6:
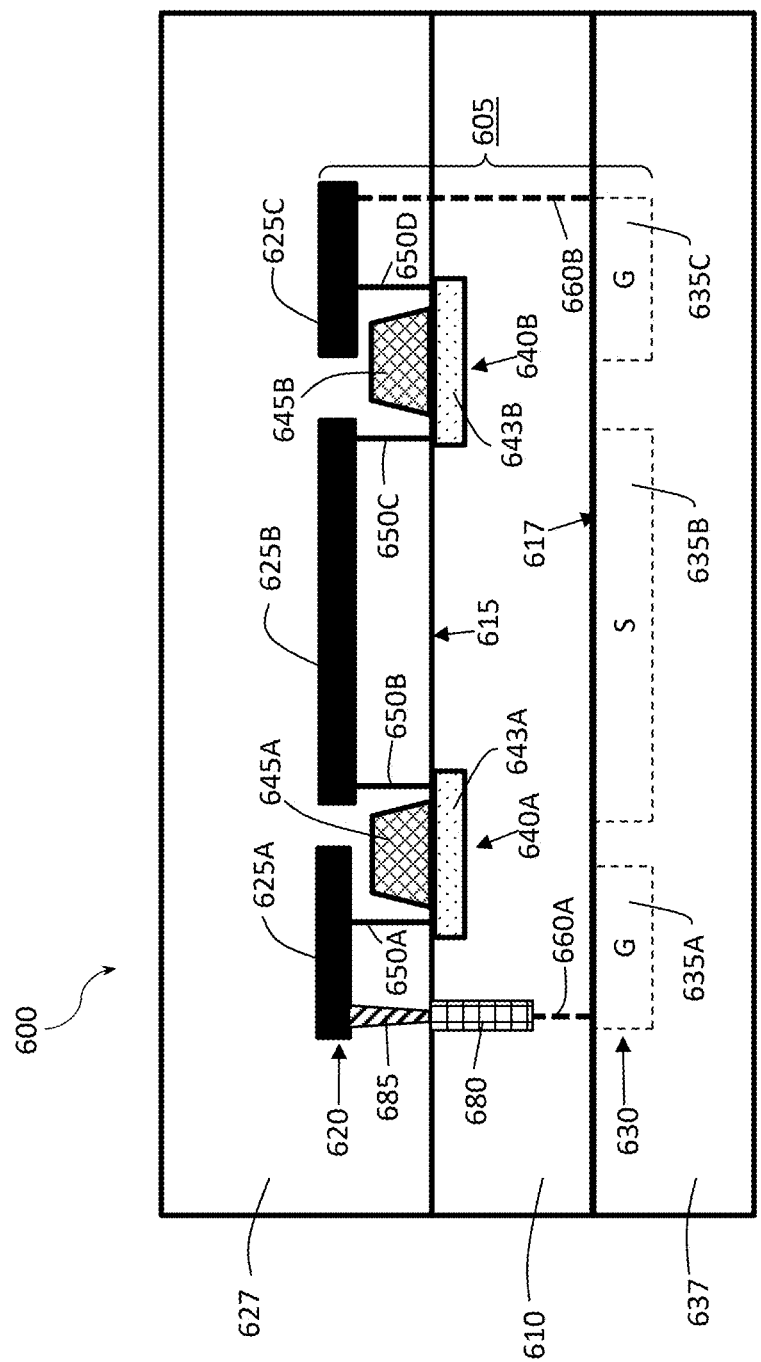
FIG. 6 is a cross-sectional view of an example IC device including a transmission line based on a buried rail and a support structure inside the transmission line, according to some embodiments of the disclosure.

FIG. 6 is a cross-sectional view of an example IC device 600 including a transmission line 605 based on a buried rail 680 and a support structure 610 inside the transmission line 605, according to some embodiments of the disclosure. The IC device 600 further includes electrically conductive layers 620 and 630 where the transmission line 605 is placed, and transistors 640. In other embodiments, the IC device 600 may include fewer, more, or different components.

The support structure 610 is a layer comprising a semiconductor material, such as silicon. The support structure 610 encloses the buried rail 680. In some embodiments, each buried rail 680 has a dielectric barrier that insulates a metal core of the buried rail 680 from the semiconductor material of the support structure 610. The dielectric barrier may be a layer of an electrical insulator (e.g., oxide material) covering part or the whole metal core.

The support structure 610 includes two semiconductor structures 643A and 643B (collectively referred to as "semiconductor structures 643" or "semiconductor structure 643"). A semiconductor structure 643 may be the same as or similar to a semiconductor structure 543 in FIG. 5. The semiconductor structure 643A forms the transistor 640A with a gate 645A. The semiconductor structure 643B forms the transistor 640B with a gate 645B. The support structure 610 may include other semiconductor structures of other transistors. The support structure 610 includes two surfaces 615 and 617. The semiconductor structures 643 are at the surface 615. The surface 617 opposes the surface 615. The side of the support structure 610 from the surface 615 upwards is referred to as the frontside, and side of the support structure 610 from the surface 617 downwards is referred to as the backside.

Electrically conductive layers may be arranged in the frontside and backside of the support structure 610. In the embodiment of FIG. 6, the electrically conductive layer 620 is the first frontside electrically conductive layer and the electrically conductive layer 630 is the first backside electrically conductive layer. In other embodiments, the IC device 600 may include other electrically conductive layers, e.g., electrically conductive layers arranged in parallel to the electrically conductive layer 620 or 630. The electrically conductive layer 620 is an embodiment of the electrically conductive layer 520 in FIG. 5. The electrically conductive layer 620 include five sections 625A-E (collectively referred to as "sections 625" or "section 625"). The sections 625 are insulated from each other. For instance, the electrically conductive layer 620 is enclosed in an insulator layer 627. The insulator layer 627 is a layer comprising an electrical insulator, such as oxide. The electrical insulator separates and insulates the sections 625 from each other.

The electrically conductive layer 630 may be the same as or similar to the electrically conductive layer 530 in FIG. 5. The electrically conductive layer 630 may include the same electrically conductive material as, or different electrically conductive material from, the electrically conductive layer 620. The electrically conductive layer 630 includes sections 635A, 635B, and 635C (collectively referred to as "sections 635" or "section 635"). The sections 635 are insulated from each other. For instance, the electrically conductive layer 620 is enclosed in an insulator layer 637. The insulator layer 637 may be the same as or similar to the insulator layer 537 in FIG. 5. Conductors of the transmission line 605 are placed in the electrically conductive layer 630. In an embodiment, a first ground conductor of the transmission line 605 is placed in the section 635A of the electrically conductive layer 630, a signal conductor of the transmission line 605 is placed in the section 635B, and a second ground conductor is placed in the section 635C.

A shield of the transmission line 605 is placed in the sections 625A-C of the electrically conductive layer 620. The shield is coupled to the ground conductors of the transmission line 605. As shown in FIG. 6, the section 625A is coupled to the section 635A by the TSV 660A, buried rail 680, and via 685. The section 635A is connected to the TSV 660A, the TSV 660A is connected to the buried rail 680, the buried rail 680 is connected to the via 685, and the via 685 is connected to the section 625A. The section 625C is coupled to the section 635C by the TSV 660B. The shield is also coupled to the transistors 640. The semiconductor structures 643 are coupled to the electrically conductive layer 620 by vias 650A-D (collectively referred to as "vias 650" or "via 650"). As shown in FIG. 6, the semiconductor structure 643A is coupled to the sections 625A and 625B of the electrically conductive layer 620 through two vias 650A-B. The semiconductor structure 643B is coupled to the sections 625B and 625C of the electrically conductive layer 620 through another two vias 650C-D. Accordingly, the transistors 640 can switch the connection of the shield, i.e., the connection of the sections 625.

Figure 7:
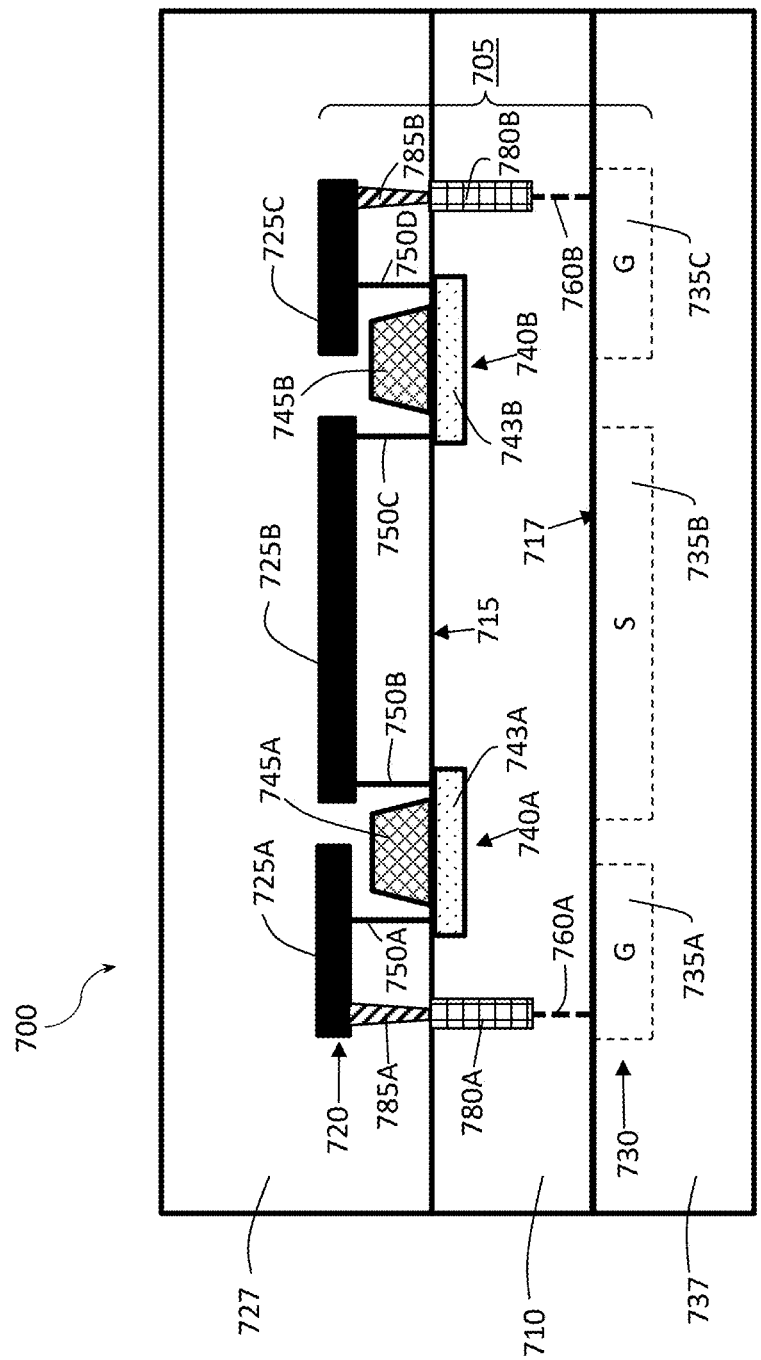
FIG. 7 is a cross-sectional view of an example IC device including a transmission line based on two buried rails and a support structure inside the transmission line, according to some embodiments of the disclosure.

FIG. 7 is a cross-sectional view of an example IC device 700 including a transmission line 705 based on two buried rails 780A-B and a support structure 710 inside the transmission line 705, according to some embodiments of the disclosure. The IC device 700 further includes electrically conductive layers 720 and 730 and transistors 740A-B. In other embodiments, the IC device 700 may include fewer, more, or different components.

The support structure 710 is a layer comprising a semiconductor material, such as silicon. The support structure 710 encloses the buried rails 780A-B (collectively referred to as "buried rails 780" or "buried rail 780") and TSVs 760A-B (collectively referred to as "TSVs 760" or "TSV 760") connected to the buried rails 780. In some embodiments, each buried rail 780 or TSV 760 has a dielectric barrier that insulates a metal core of the buried rail 780 or TSV 760 from the semiconductor material of the support structure 710. The dielectric barrier may be a layer of an electrical insulator (e.g., oxide material) covering part or the whole metal core. The support structure 710 includes two semiconductor structures 743A and 743B (collectively referred to as "semiconductor structures 743" or "semiconductor structure 743"). A semiconductor structure 743 may be the same as or similar to a semiconductor structure 543 in FIG. 5 or a semiconductor structure 643 in FIG. 6. The semiconductor structure 743A forms the transistor 740A with a gate 745A. The semiconductor structure 743B forms the transistor 740B with a gate 745B. The support structure 710 may include other semiconductor structures of other transistors.

The support structure 710 includes two surfaces 715 and 717. The semiconductor structures 743 are at the surface 715. The surface 715 opposes the surface 717. The side of the support structure 710 from the surface 715 upwards is referred to as the frontside of the support structure 710 and the frontside of the IC device 700, and the side of the support structure 710 from the surface 717 downwards is referred to as the backside. Electrically conductive layers may be arranged in the frontside and backside of the support structure 710. In the embodiment of FIG. 7, the electrically conductive layer 720 is the first frontside electrically conductive layer. The electrically conductive layer 730 is the first backside electrically conductive layer. An electrically conductive layer is a layer comprising an electrically conductive material, e.g., metal. The electrically conductive layers 720 and 730 may have the same or different electrically conductive materials. In other embodiments, the IC device 700 may include other electrically conductive layers, e.g., electrically conductive layers arranged in parallel to the electrically conductive layer 720 or 730.

The electrically conductive layer 720 may be the same as or similar to the electrically conductive layer 520 in FIG. 5. The electrically conductive layer 730 may be the same as or similar to the electrically conductive layer 530 in FIG. 5. The electrically conductive layer 730 may include the same electrically conductive material as, or different electrically conductive material from, the electrically conductive layer 720. The electrically conductive layer 730 includes sections 735A, 735B, and 735C (collectively referred to as "sections 735" or "section 735"). The sections 735 are insulated from each other. For instance, the electrically conductive layer 720 is enclosed in an insulator layer 737. The insulator layer 737 may be the same as or similar to the insulator layer 537 in FIG. 5.

A shield of the transmission line 705 is placed in the electrically conductive layer 720. Conductors of the transmission line 705 are placed in the electrically conductive layer 730. In an embodiment, a first ground conductor of the transmission line 705 is placed in the section 735A of the electrically conductive layer 730, a signal conductor of the transmission line 705 is placed in the section 735B, and a second ground conductor is placed in the section 735C. The shield is coupled to the ground conductors of the transmission line 705. As shown in FIG. 7, the section 725A is coupled to the section 735A by the TSV 760A, buried rail 780A, and via 785A. The section 735A is connected to the TSV 760A, the TSV 760A is connected to the buried rail 780A, the buried rail 780A is connected to the via 785A, and the via 785A is connected to the section 725A. Similarly, the section 725C is coupled to the section 735C by the TSV 760B, buried rail 780B, and via 785B. The shield is also coupled to the transistors 740. The semiconductor structures 743 are coupled to the electrically conductive layer 720 by vias 750A-D (collectively referred to as "vias 750" or "via 750"). As shown in FIG. 7, the semiconductor structure 743A is coupled to the sections 725A and 725B of the electrically conductive layer 720 through two vias 750A-B. The semiconductor structure 743B is coupled to the sections 725B and 725C of the electrically conductive layer 720 through another two vias 750C-D. Accordingly, the transistors 740 can switch the connection of the shield, i.e., the connection of the sections 725.

Figure 8:
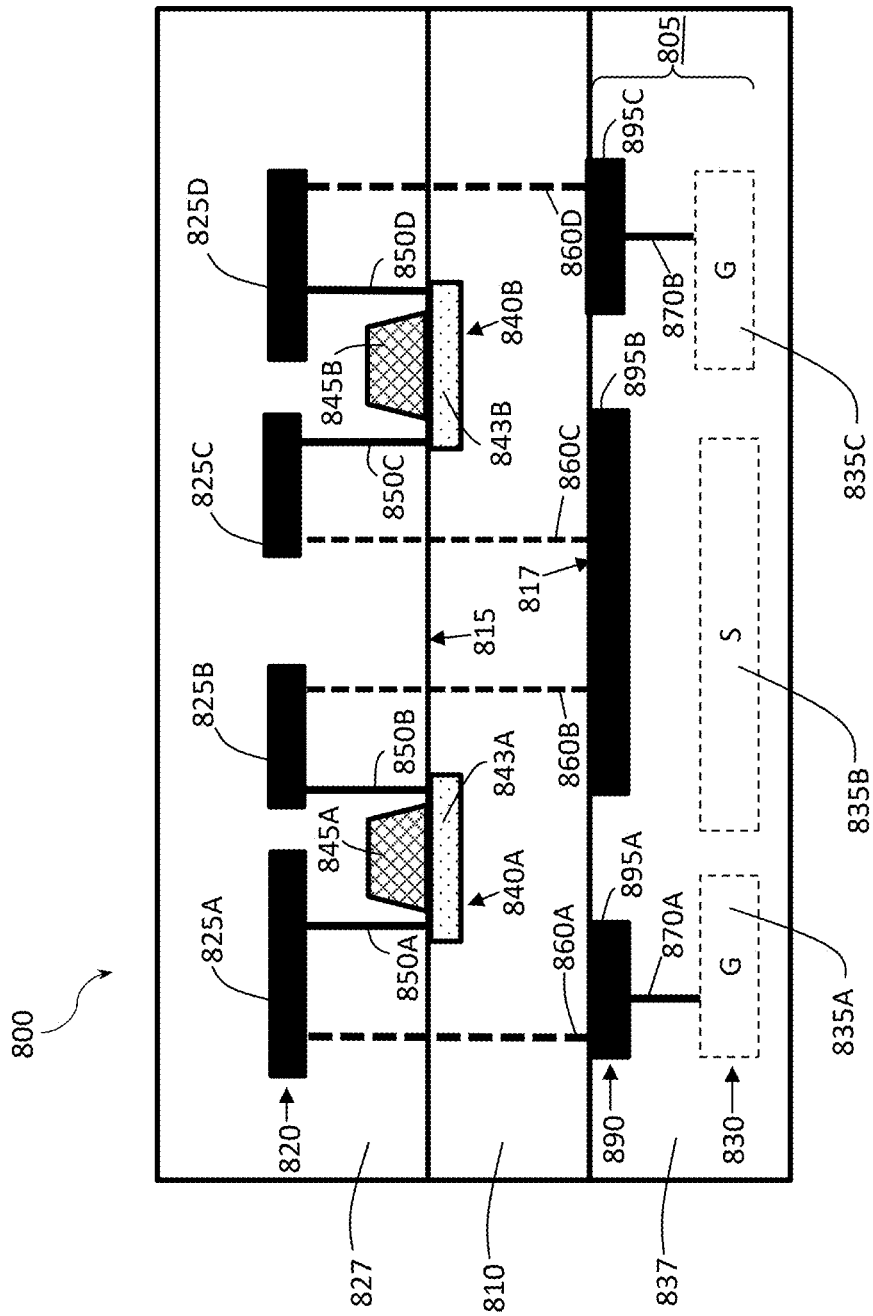
FIG. 8 is a cross-sectional view of an example IC device including a transmission line and a support structure outside the transmission line, according to some embodiments of the disclosure.

FIG. 8 is a cross-sectional view of an example IC device 800 including a transmission line 805 and a support structure 810 outside the transmission line 805, according to some embodiments of the disclosure. The IC device 800 further includes electrically conductive layers 820, 830, and 890 and transistors 840A-B. In other embodiments, the IC device 800 may include fewer, more, or different components.

The support structure 810 is a layer comprising a semiconductor material, such as silicon. The support structure 810 includes two semiconductor structures 843A and 843B (collectively referred to as "semiconductor structures 843" or "semiconductor structure 843"). A semiconductor structure 843 may be the same as or similar to a semiconductor structure 543 in FIG. 5. The semiconductor structure 843A forms the transistor 840A with a gate 845A. The semiconductor structure 843B forms the transistor 840B with a gate 845B. The support structure 810 may include other semiconductor structures of other transistors. The gates 845A-B are over the support structure 810.

The support structure 810 includes two surfaces 815 and 817. The semiconductor structures 843 are at the surface 815. The surface 815 opposes the surface 817. The surface 815 can be the frontside surface of the support structure 810. The side of the support structure 810 from the surface 815 upwards is referred to as the frontside of the support structure 810 and the IC device 800. The surface 817 can be the backside surface of the support structure 810. The side of the support structure 810 from the surface 817 downwards is referred to as the backside. Electrically conductive layers may be arranged in the frontside and backside of the support structure 810. In the embodiment of FIG. 8, the electrically conductive layer 820 is the first frontside electrically conductive layer. The electrically conductive layer 820 is closer to the surface 815 than the surface 817. The electrically conductive layer 890 is the first backside electrically conductive layer and is between the electrically conductive layers 820 and 830. The electrically conductive layers 830 and 890 are both at the backside and therefore, are closer to the surface 817 than the surface 815. An electrically conductive layer is a layer comprising an electrically conductive material, e.g., metal. The electrically conductive layers 820, 830, and 890 may have the same or different electrically conductive materials. In other embodiments, the electrically conductive layers 820, 830, and 890 may be arranged differently. For instance, the electrically conductive layer 830 may be the first backside electrically conductive layer. Also, the IC device 800 may include other electrically conductive layers, e.g., electrically conductive layers arranged in parallel to the electrically conductive layer 820 or 830.

The electrically conductive layer 820 include sections 825A-D (collectively referred to as "sections 825" or "section 825"). The sections 825 are insulated from each other. For instance, the electrically conductive layer 820 is enclosed in an insulator layer 827. The insulator layer 827 is a layer comprising an electrical insulator, such as oxide. The electrical insulator separates and insulates the sections 825 from each other. As shown in FIG. 8, the semiconductor structure 843A is coupled to the sections 825A and 825B of the electrically conductive layer 820 through two vias 850A-B. The semiconductor structure 843B is coupled to the sections 825C and 825D of the electrically conductive layer 820 through another two vias 850C-D. The vias A-D are outside the support structure 810.

The electrically conductive layer 830 may include the same electrically conductive material as, or different from, the electrically conductive layer 820. The electrically conductive layer 830 includes sections 835A, 835B, and 835C (collectively referred to as "sections 835" or "section 835"). The sections 835 are insulated from each other. For instance, the electrically conductive layer 820 is enclosed in an insulator layer 837. The insulator layer 837 is a layer comprising an electrical insulator, such as oxide. The electrical insulator separates and insulates the sections 835 from each other. Conductors of the transmission line 805 are placed in the electrically conductive layer 830. In an embodiment, a first ground conductor of the transmission line 805 is placed in the section 835A of the electrically conductive layer 830, a signal conductor of the transmission line 805 is placed in the section 835B, and a second ground conductor is placed in the section 835C. Accordingly, the signal conductor is between the two ground conductors.

The electrically conductive layer 890 includes sections 895A-C (collectively referred to as "sections 895" or "section 895"). The sections 895 are insulated from each other. For instance, the electrically conductive layer 890 is enclosed in an insulator layer 837. The insulator layer 837 is a layer comprising an electrical insulator, such as an oxide material. The electrical insulator separates and insulates the sections 895 from each other.

A shield of the transmission line 805 are placed in the electrically conductive layer 890. The ground conductors of the transmission line 805 are coupled to the shield by vias 870A-B. As shown in FIG. 8, the ground conductor placed in the section 835A of the electrically conductive layer 830 is coupled to the section 895A of the electrically conductive layer 820 by the via 870A. The ground conductor placed in the section 835C of the electrically conductive layer 830 is coupled to the section 895C of the electrically conductive layer 890 by the via 870B. The shield is coupled to the semiconductor structures 843 of the transistors by TSVs 860A-D (collectively referred to as "TSVs 860" or "TSV 860"), the electrically conductive layer 820, and vias 850. The TSVs 860 routes the shield to the frontside of the support structure 810. Thus, the transistors can switch the connection of the shield. The transmission line 805 may be a switched slow wave transmission line. In other embodiments, the transmission line 805 may be other types of transmission lines, such as slow wave transmission lines without switches (e.g., the shield of the transmission line 805 is not coupled to the semiconductor structures 543), microstrip transmission lines, coplanar waveguide transmission lines, and so on.

As the electrically conductive layers 830 and 890, where the transmission line 805 is placed, are both at the backside of the support structure 810, the support structure 810 is outside the transmission line 805. In contrast, the support structure 510 in FIG. 5 is inside the transmission line 505. Compared with the transmission line 505, the transmission line 805 is better shielded from substrate effects caused by the support structure 810. In some embodiments, the thickness of the electrically conductive layer 830 is larger than the thickness of the electrically conductive layer 820. A thicker electrically conductive layer has less resistance. This can result in lower attenuation and better performance of the transmission line 805. Even though the shield is placed at the backside in FIG. 8, the shield can still be closer to the switching transistors, compared with the shield in FIG. 4, given that based on the BPR technology, the support structure 810 can be very thin, such as around 0.5 um. The BPR technology uses such support structure to be able to achieve small TSV diameters and pitches. Thus, the conductors of the transmission line 805 can be very close to the semiconductor structures 843. This results in very low losses due to the semiconductor layer (e.g., the support structure 810) and enables the configuration of the transmission line in FIG. 8. The BPRs can be buried in the support structure 810 and be used for frontside or backside power delivery.

Figure 9:
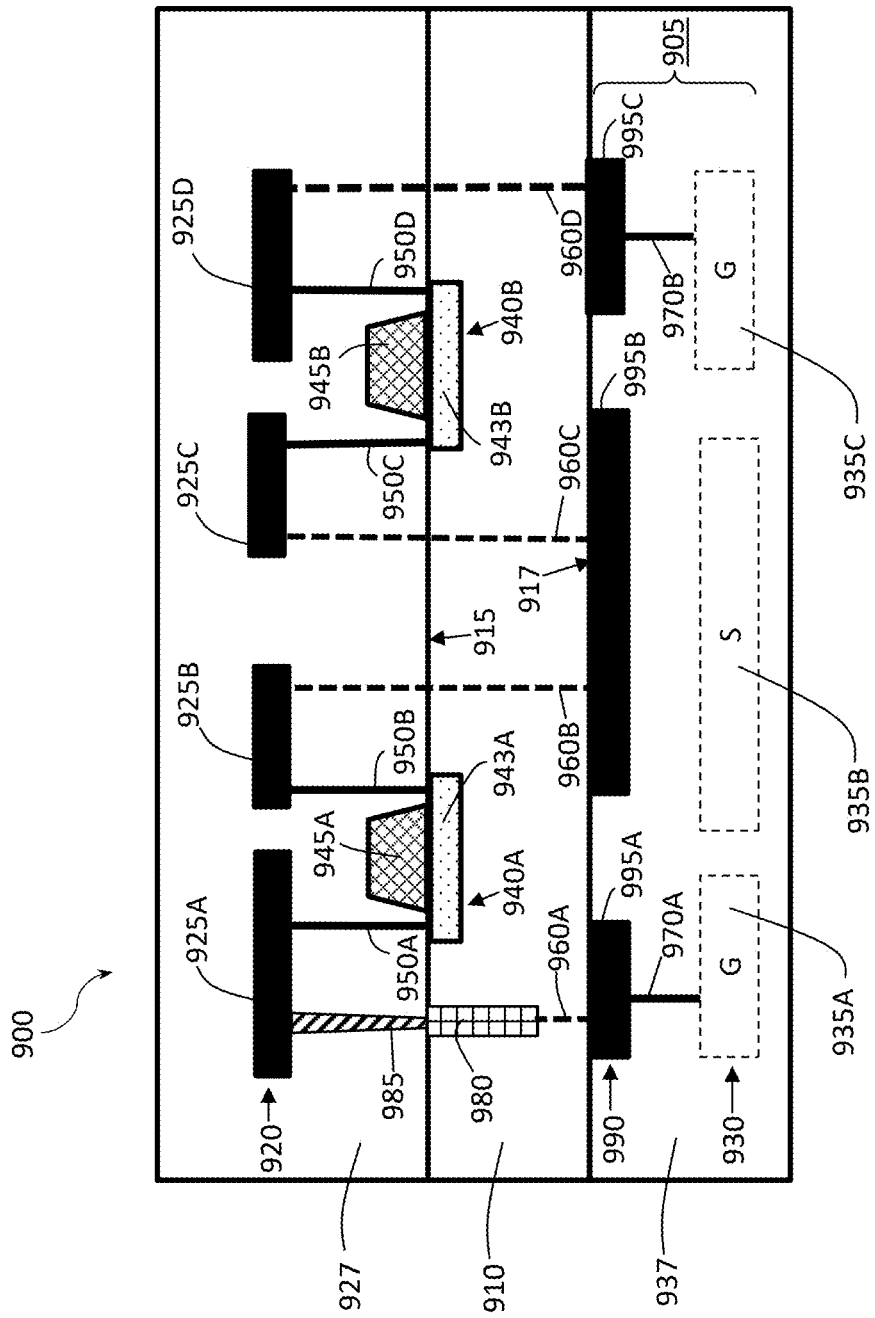
FIG. 9 is a cross-sectional view of an example IC device including a transmission line based on a buried rail and a support structure outside the transmission line, according to some embodiments of the disclosure.

FIG. 9 is a cross-sectional view of an example IC device 900 including a transmission line 905 based on a buried rail 980 and a support structure 910 outside the transmission line 905, according to some embodiments of the disclosure. The IC device 900 further includes electrically conductive layers 920, 930, and 990 and transistors 940A-B. In other embodiments, the IC device 900 may include fewer, more, or different components.

The support structure 910 is a layer comprising a semiconductor material, such as silicon. The support structure 910 includes the buried rail 980. In some embodiments, each buried rail 980 has a dielectric barrier that insulates a metal core of the buried rail 980 from the semiconductor material of the support structure 910. The dielectric barrier may be a layer of an electrical insulator (e.g., oxide material) covering part or the whole metal core. The support structure 910 includes two semiconductor structures 943A and 943B (collectively referred to as "semiconductor structures 943" or "semiconductor structure 943"). A semiconductor structure 943 may be the same as or similar to a semiconductor structure 543 in FIG. 5. The semiconductor structure 943A forms the transistor 940A with a gate 945A. The semiconductor structure 943B forms the transistor 940B with a gate 945B. The transistors 940A-B are collectively referred to as transistors 940 or transistor 940. The support structure 910 may include other semiconductor structures of other transistors. The support structure 910 includes two surfaces 915 and 917. The semiconductor structures 943 are at the surface 915. The surface 915 opposes the surface 917. The side of the support structure 910 from the surface 915 upwards is referred to as the frontside, and the side of the support structure 910 from the surface 917 downwards is referred to as the backside.

Electrically conductive layers may be arranged in the frontside and backside of the support structure 910. In the embodiment of FIG. 9, the electrically conductive layer 920 is the first frontside electrically conductive layer. The electrically conductive layer 990 is the first backside electrically conductive layer and is between the electrically conductive layers 920 and 930. An electrically conductive layer is a layer comprising an electrically conductive material, e.g., metal. The electrically conductive layers 920, 930, and 990 may have the same or different electrically conductive materials. In other embodiments, the electrically conductive layers 920, 930, and 990 may be arranged differently. Also, the IC device 900 may include other electrically conductive layers, e.g., electrically conductive layers arranged in parallel to the electrically conductive layer 920 or 930.

The electrically conductive layer 920 is an embodiment of the electrically conductive layer 820 in FIG. 8. The electrically conductive layer 920 includes sections 925A-E (collectively referred to as "sections 925" or "section 925"). The sections 925 are insulated from each other. For instance, the electrically conductive layer 920 is enclosed in an insulator layer 927. The insulator layer 927 is a layer comprising an electrical insulator, such as oxide. The electrical insulator separates and insulates the sections 925 from each other. The electrically conductive layer 930 is an embodiment of the electrically conductive layer 830 in FIG. 8. Conductors of the transmission line 905 are placed in the electrically conductive layer 930.

A shield of the transmission line 905 is placed in the electrically conductive layer 990. The electrically conductive layer 990 is an embodiment of the electrically conductive layer 890 in FIG. 8. In FIG. 9, the ground conductors of the transmission line 905 are coupled to the shield by vias 970A-B in the backside layer 937. The shield is also coupled to the transistors 940 by vias 950, the electrically conductive layer 920, via 985, buried rail 980, and TSVs 960A-D. As shown in FIG. 9, the section 995A is coupled to the transistor 940A by the TSV 960A, buried rail 980, via 985, the section 925A, and the via 950A. The section 995B is coupled to the transistors 940 by the TSVs 960B-C, sections 925B-C, and vias 950B-C. The section 995C is coupled to the transistor 940B by the TSV 960D, section 925D, and via 950D. Thus, the transistors 940 can switch the connection of the shield, i.e., the connection of the sections 995 of the electrically conductive layer 990.

As shown in FIG. 9, the semiconductor structure 943A is coupled to the sections 925A and 925B of the electrically conductive layer 920 through two vias 950A-B. The semiconductor structure 943B is coupled to the sections 925C and 925D of the electrically conductive layer 920 through another two vias 950C-D. The buried rail 980 is coupled to the electrically conductive layer 920 by an additional via 985, which is separated and insulated from the vias 950. As shown in FIG. 9, the buried rail 980 is connected to the via 985 and the via 985 is connected to the section 925A of the electrically conductive layer 920. The buried rails 980 are separated and insulated from the TSVs 960.

Figure 10:
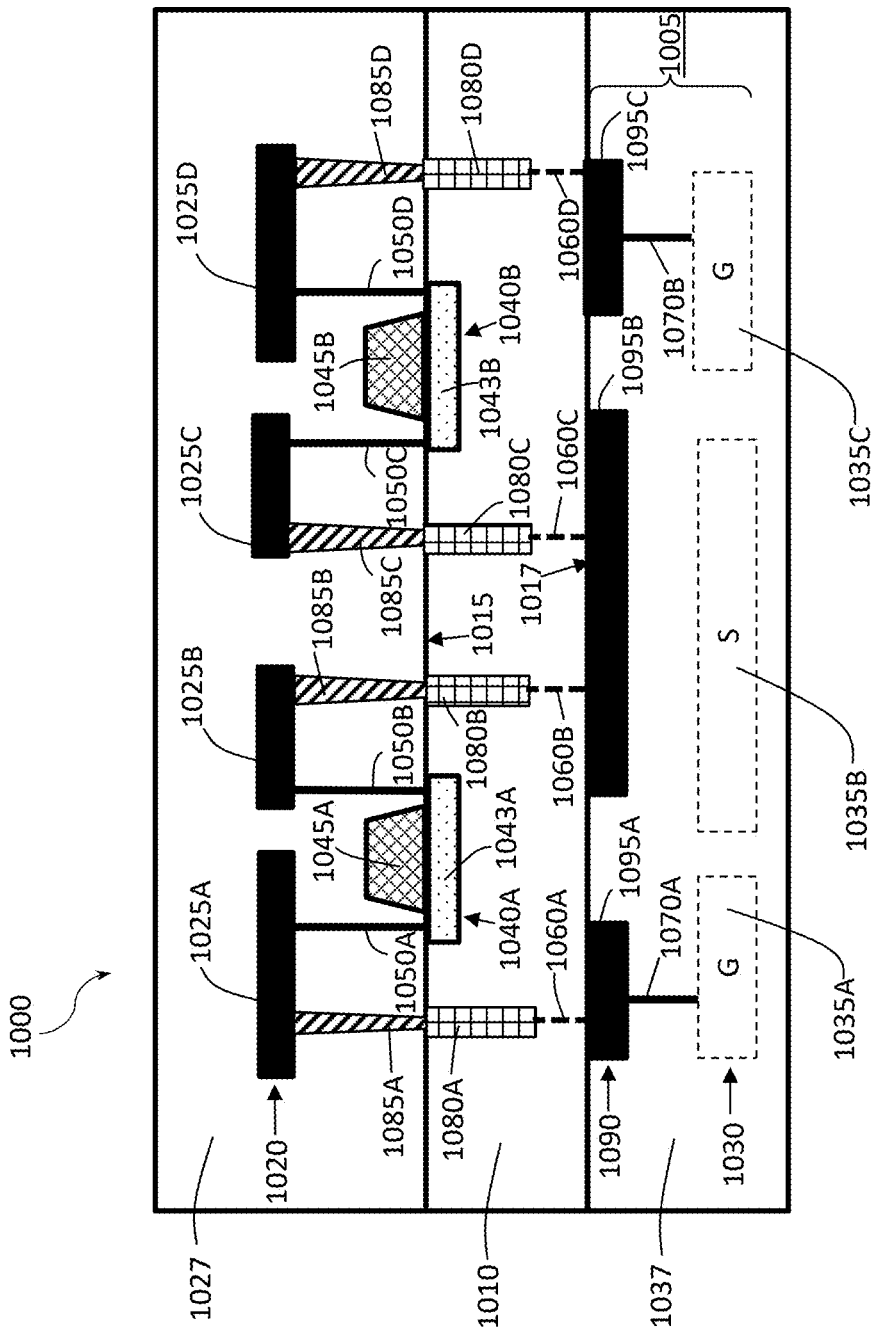
FIG. 10 is a cross-sectional view of an example IC device including a transmission line based on multiple buried rails and a support structure outside the transmission line, according to some embodiments of the disclosure.

FIG. 10 is a cross-sectional view of an example IC device 1000 including a transmission line 1005 based on multiple buried rails 1080A-D and a support structure 1010 outside the transmission line 1005, according to some embodiments of the disclosure. The IC device 1000 further includes electrically conductive layers 1020, 1030, and 1090, and transistors 1040A-B. In other embodiments, the IC device 1000 may include fewer, more, or different components. The IC device 1000 is an embodiment of the IC device 800 in FIG. 8.

The support structure 1010 is a layer comprising a semiconductor material, such as silicon. The support structure 1010 includes the buried rails 1080A-D (collectively referred to as "buried rails 1080" or "buried rail 1080") and TSVs 1060A-D (collectively referred to as "TSVs 1060" or "TSV 1060"). In some embodiments, each buried rail 1080 or TSV 10605 has a dielectric barrier that insulates a metal core of the buried rail 1080 or TSV 1060 from the semiconductor material of the support structure 1010. The dielectric barrier may be a layer of an electrical insulator (e.g., oxide material) covering part or the whole metal core.

The support structure 1010 includes two semiconductor structures 1043A and 1043B (collectively referred to as "semiconductor structures 1043" or "semiconductor structure 1043"). A semiconductor structure 1043 may be the same as or similar to a semiconductor structure 843 in FIG. 8. The semiconductor structure 1043A forms the transistor 1040A with a gate 1045A. The semiconductor structure 1043B forms the transistor 1040B with a gate 1045B. The transistors 1040A-B are collectively referred to as transistors 1040 or transistor 1040. The support structure 1010 may include other semiconductor structures of other transistors. The support structure 1010 includes two surfaces 1015 and 1017. The semiconductor structures 1043 are at the surface 1015. The surface 1015 opposes the surface 1017. The side of the support structure 1010 from the surface 1015 upwards is referred to as the frontside, and the side of the support structure 1010 from the surface 1017 downwards is referred to as the backside of the support structure 1010.

Electrically conductive layers may be arranged in the frontside and backside of the support structure 1010. In the embodiment of FIG. 10, the electrically conductive layer 1020 is the first frontside electrically conductive layer. The electrically conductive layer 1090 is the first backside electrically conductive layer, followed by the electrically conductive layer 1090, then the electrically conductive layer 1030. The electrically conductive layer 1090 is between the electrically conductive layers 1020 and 1030. An electrically conductive layer is a layer comprising an electrically conductive material, e.g., metal. The electrically conductive layers 1020, 1030, and 1090 may have the same or different electrically conductive materials. In other embodiments, the electrically conductive layers 1020, 1030, and 1090 may be arranged differently. Also, the IC device 1000 may include other electrically conductive layers, e.g., electrically conductive layers arranged in parallel to the electrically conductive layer 1020 or 1030. The electrically conductive layer 1020 is an embodiment of the electrically conductive layer 820 in FIG. 8. The electrically conductive layer 1020 includes sections 1025A-D (collectively referred to as "sections 1025" or "section 1025"). The electrically conductive layer 1020 is in a frontside layer 1027 that adjoins the support structure 1010 at the surface 1015. The frontside layer 1027 includes an electrical insulator that separates and insulates the sections 1025 from each other. The electrically conductive layer 1030 is an embodiment of the electrically conductive layer 830 in FIG. 8. The electrically conductive layer 1030 includes sections 1035A-C. The electrically conductive layer 1090 is an embodiment of the electrically conductive layer 890 in FIG. 8. The electrically conductive layer 1090 includes sections 1095A-C (collectively referred to as "sections 1095" or "section 1095"). The electrically conductive layers 1030 and 1090 are in a backside layer 1037 that adjoins the support structure 1010 at the surface 1017. The backside layer 1037 includes an electrical insulator that separates and insulates the sections 1035 and sections 1095 from each other.

Conductors of the transmission line 1005 are placed in the electrically conductive layer 1030. For instance, a first ground conductor is placed in the section 1035A, a signal conductor is placed in the section 1035B, and a second ground conductor is placed in the section 1035C. A shield of the transmission line 1005 is placed in the electrically conductive layer 1090. The shield is coupled to the ground conductors by vias 1070A-B in the backside layer 1037. The shield is also coupled to the transistors 1040 by vias 1050, the electrically conductive layer 1020, vias 1085A-D (collectively referred to as "vias 1085" or "via 1085"), buried rails 1080, and TSVs 1060. As shown in FIG. 10, the section 1095A is coupled to the transistor 1040A by the TSV 1060A, buried rail 1080A, via 1085A, the section 1025A, and the via 1050A. The section 1095B is coupled to the transistors 1040 by the TSV 1060B-C, buried rails 1080B-C, vias 1085B-C, the sections 1025B-C, and the vias 1050 B-C. The section 1095C is coupled to the transistor 1040B by the TSV 1060D, buried rail 1080D, via 1085D, the section 1025D, and the via 1050D. A buried rail 1080 is connected to a TSV 1060, which is connected to a section 1095. A via 1085 is connected to a BPR 1080 and a section 1025. The vias 1085 are separated and insulated from each other and from the vias 1050. Thus, the transistors 1040B can switch the connection of the shield, i.e., the connection of the sections 1095 of the electrically conductive layer 1090.

As shown in FIG. 10, the semiconductor structure 1043A is coupled to the sections 1025A and 1025B of the electrically conductive layer 1020 through two vias 1050A-B. The semiconductor structure 1043B is coupled to the sections 1025C and 1025D of the electrically conductive layer 1020 through another two vias 1050C-D. The buried rail 1080 is coupled to the electrically conductive layer 1020 by an additional via 1085, which is separated and insulated from the vias 1050. As shown in FIG. 10, the buried rail 1080 is connected to the via 1085 and the via 1085 is connected to the section 1025A of the electrically conductive layer 1020. The buried rails 1080 are separated and insulated from the TSVs 1060.

Figure 11B:
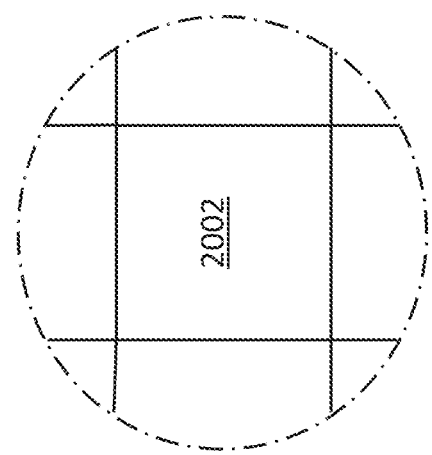
FIGS. 11A-11B are top views of a wafer and dies that may include one or more transmission lines, according to some embodiments of the disclosure.
Figure 11A:
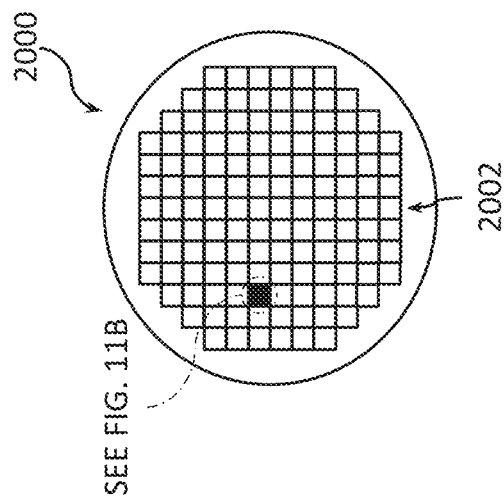

FIGS. 11A-11B are top views of a wafer 2000 and dies 2002 that may include one or more transmission lines, according to some embodiments of the disclosure. In some embodiments, the dies 2002 may be included in an IC package, according to some embodiments of the disclosure. For example, any of the dies 2002 may serve as any of the dies 2256 in an IC package 2200 shown in FIG. 12. The wafer 2000 may be composed of semiconductor material and may include one or more dies 2002 having IC devices formed on a surface of the wafer 2000. Each of the dies 2002 may be a repeating unit of a semiconductor product that includes any suitable IC (e.g., ICs including one or more BPRs as described herein). After the fabrication of the semiconductor product is complete (e.g., after manufacture of one or more BPRs as described herein), the wafer 2000 may undergo a singulation process in which each of the dies 2002 is separated from one another to provide discrete "chips" of the semiconductor product. In particular, devices that include one or more BPRs as disclosed herein may take the form of the wafer 2000 (e.g., not singulated) or the form of the die 2002 (e.g., singulated). The die 2002 may include one or more diodes (e.g., one or more BPRs as described herein), one or more transistors (e.g., one or more III-N transistors as described herein) as well as, optionally, supporting circuitry to route electrical signals to the III-N diodes with n-doped wells and capping layers and III-N transistors, as well as any other IC components. In some embodiments, the wafer 2000 or the die 2002 may implement an electrostatic discharge (ESD) protection device, an RF FE device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 12:
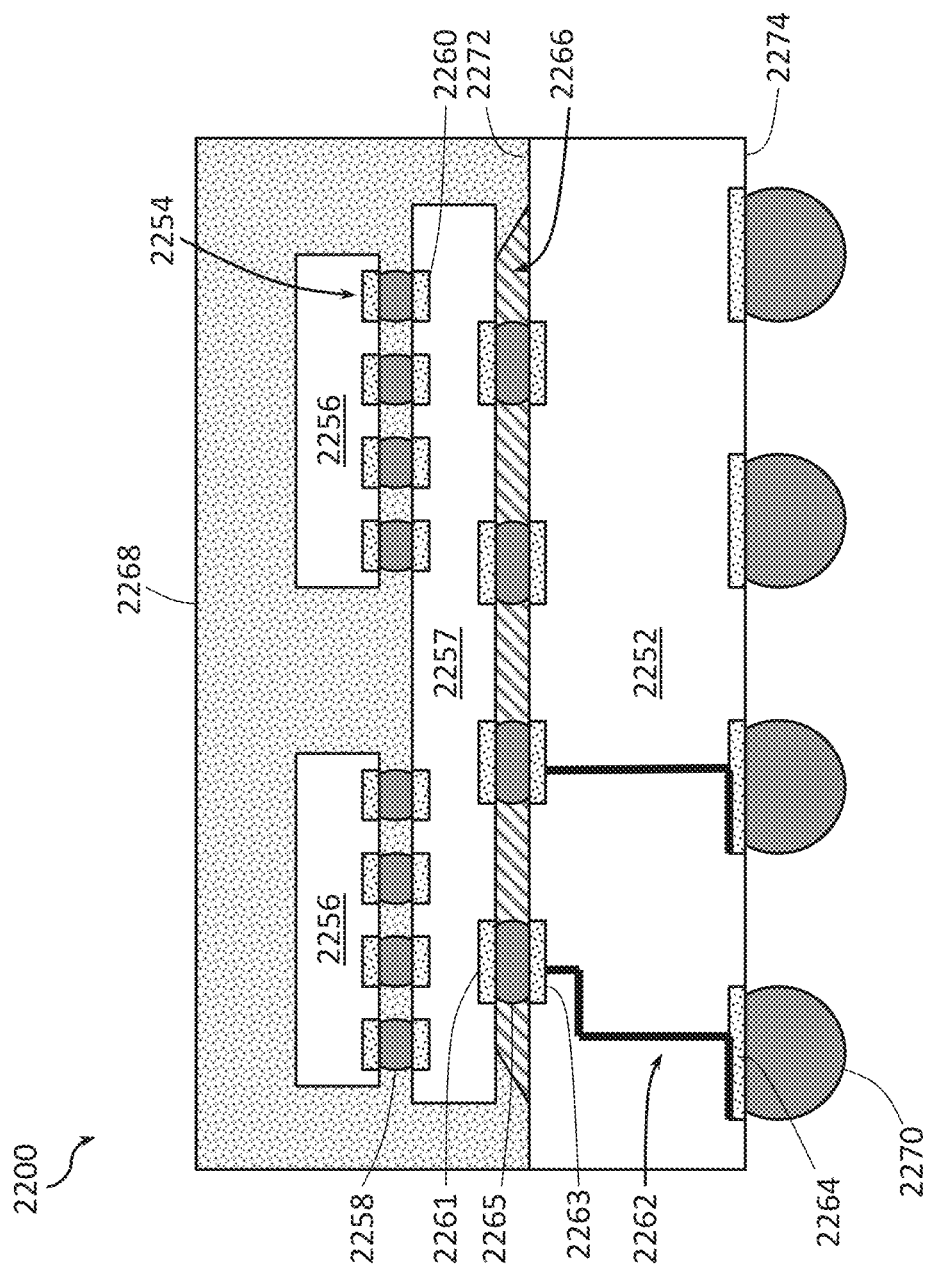
FIG. 12 is a side, cross-sectional view of an example IC package that may include one or more IC devices having transmission lines, according to some embodiments of the disclosure.

FIG. 12 is a side, cross-sectional view of an example IC package 2200 that may include one or more IC devices having transmission lines, according to some embodiments of the disclosure. In some embodiments, the IC package 2200 may be a system-in-package (SiP).

As shown in FIG. 12, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 12 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 12 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 12 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 13.

The dies 2256 may take the form of any of the embodiments of the die 2002 discussed herein and may include any of the embodiments of an IC device having one or more BPRs. In embodiments in which the IC package 2200 includes multiple dies 2256, the IC package 2200 may be referred to as a multi-chip package. Importantly, even in such embodiments of an MCP implementation of the IC package 2200, one or more BPRs may be provided in a single chip, in accordance with any of the embodiments described herein. The dies 2256 may include circuitry to perform any desired functionality. For example, one or more of the dies 2256 may be ESD protection dies, including one or more BPRs as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more BPRs, e.g., as discussed above; in some embodiments, at least some of the dies 2256 may not include any III-N diodes with n-doped wells and capping layers.

The IC package 2200 illustrated in FIG. 12 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 12, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 13:
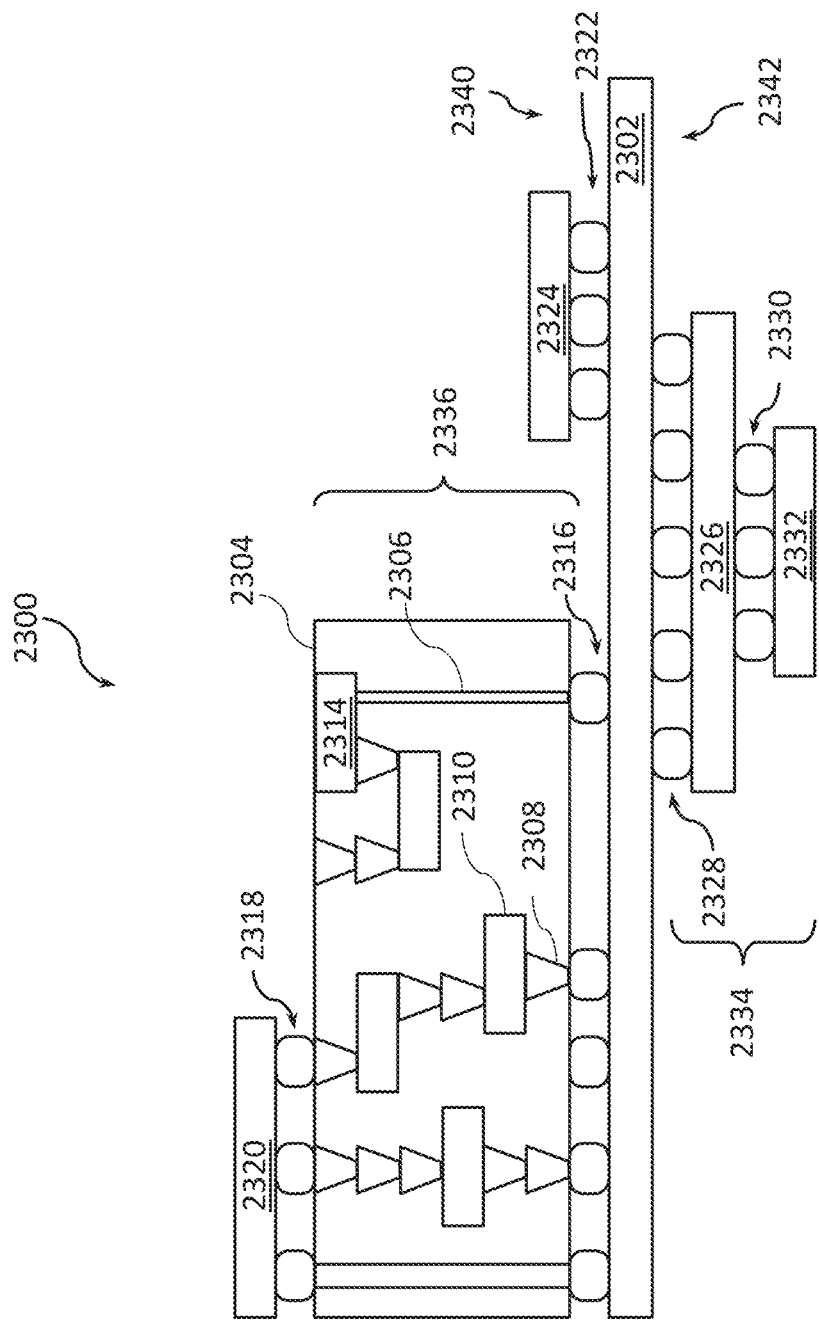
FIG. 13 is a cross-sectional side view of an IC device assembly that may include components having one or more IC devices implementing transmission lines, according to some embodiments of the disclosure.

FIG. 13 is a cross-sectional side view of an IC device assembly 2300 that may include components having one or more IC devices implementing transmission lines, according to some embodiments of the disclosure. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices implementing one or more BPRs in accordance with any of the embodiments disclosed herein; e.g., any of the IC packages discussed below with reference to the IC device assembly 2300 may take the form of any of the embodiments of the IC package 2200 discussed above with reference to FIG. 12 (e.g., may include one or more BPRs in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 13 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 13), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 11B), an IC device (e.g., the IC device of FIGS. 1-2), or any other suitable component. In particular, the IC package 2320 may include one or more BPRs as described herein. Although a single IC package 2320 is shown in FIG. 13, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 13, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC devices implementing one or more BPRs as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 13 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 14:
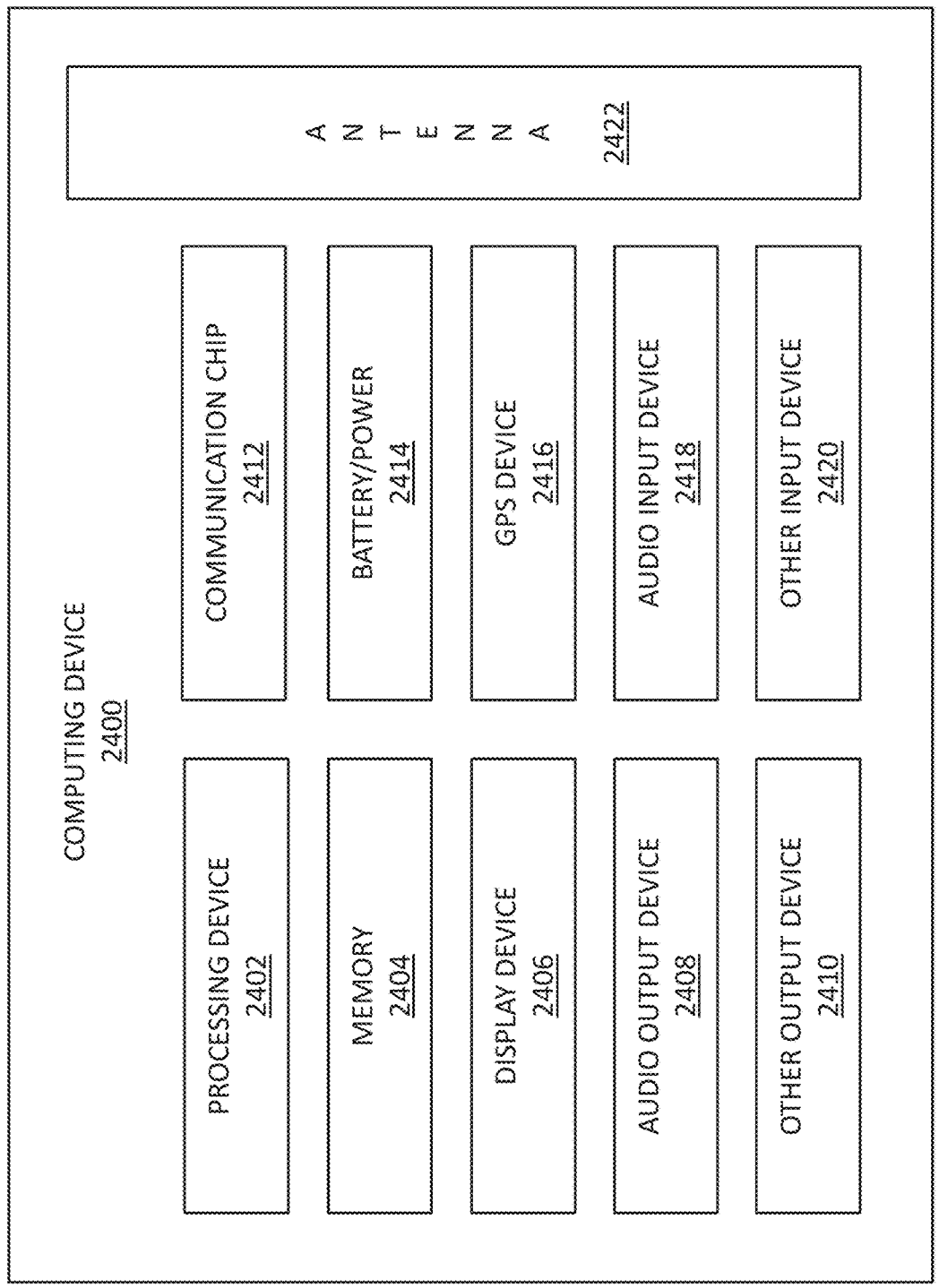
FIG. 14 is a block diagram of an example computing device that may include one or more components with transmission lines, according to some embodiments of the disclosure.

FIG. 14 is a block diagram of an example computing device 2400 that may include one or more components with one or more IC devices having one or more BPRs, according to some embodiments of the disclosure. For example, any suitable ones of the components of the computing device 2400 may include a die (e.g., the die 2002 of FIG. 11B) including one or more BPRs, according to some embodiments of the disclosure. Any of the components of the computing device 2400 may include an IC device (e.g., any embodiment of the IC devices of FIGS. 1-4) and/or an IC package (e.g., the IC package 2200 of FIG. 12). Any of the components of the computing device 2400 may include an IC device assembly (e.g., the IC device assembly 2300 of FIG. 13).

A number of components are illustrated in FIG. 14 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 14, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC devices having one or more BPRs as described herein may be particularly advantageous for use as part of ESD circuits protecting power amplifiers, low-noise amplifiers, filters (including arrays of filters and filter banks), switches, or other active components. In some embodiments, IC devices having one or more BPRs as described herein may be used in PMICs, e.g., as a rectifying diode for large currents. In some embodiments, IC devices having one or more BPRs as described herein may be used in audio devices and/or in various input/output devices.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

Example 1 provides an IC device, including: a support structure having a first surface and a second surface opposing the first surface; a first transistor over or at least partially in the support structure; a second transistor over or at least partially in the support structure; a first layer including a first electrically conductive material, where the first layer is closer to the first surface than to the second surface, and the first layer is coupled to the first transistor and the second transistor; a second layer including a second electrically conductive material and a shield of a transmission line, where the second layer is closer to the second surface than to the first surface, the second layer is coupled to the first layer by a first via, and at least a portion of the first via is inside the support structure; and a third layer including a third electrically conductive material and conductors of the transmission line, where the third layer is closer to the second surface than the first surface, the third layer is coupled to the second layer by a second via, and the second via is outside the support structure.

Example 2 provides the IC device according to example 1, where: the second layer includes: a first section including a first portion of the second electrically conductive material, a second section including a second portion of the second electrically conductive material, and a third section including a third portion of the second electrically conductive material, the first section is coupled to the first transistor, the second section is coupled to the first transistor and the second transistor, and the third section is coupled to the second transistor.

Example 3 provides the IC device according to example 2, where the first section, the second section, and the third section are separated by an electrical insulator, and the second section is between the first section and the third section.

Example 4 provides the IC device according to any of the preceding examples, where the second layer is between the support structure and the third layer.

Example 5 provides the IC device according to any of the preceding examples, where the conductors of the transmission line include a first ground conductor, a second ground conductor, and a signal conductor, and the signal conductor is between the first ground conductor and the second ground conductor.

Example 6 provides the IC device according to example 5, where the first ground conductor is coupled to a first section of the second layer by the second via, the second ground conductor is coupled to a second section of the second layer by a third via, and the third via outside the support structure.

Example 7 provides the IC device according to any of the preceding examples, where the second layer is coupled to the first layer further by a buried rail in the support structure, and the buried rail is connected to the first via.

Example 8 provides the IC device according to any of the preceding examples, where the second layer is coupled to the first layer further by a third via, the third via is outside the support structure, and the buried rail is connected to the third via.

Example 9 provides the IC device according to example 8, where the third via is closer to the first surface than the second surface, and the second via is closer to the second surface than the first surface.

Example 10 provides the IC device according to any of the preceding examples, where a thickness of the third layer is larger than a thickness of the first layer.

Example 11 provides an IC device, including: a support structure having a first surface and a second surface opposing the first surface; a first layer including a first electrically conductive material and a shield of a transmission line, where the first layer is closer to the first surface than the second surface; and a second layer including a second electrically conductive material and conductors of the transmission line, where the second layer is closer to the second surface than the first surface, the second layer is coupled to the first layer by a via, at least a portion of the via is in the support structure.

Example 12 provides the IC device according to example 11, where: the first layer is in a third layer, the third layer includes a first electrical insulator, the second layer is in a fourth layer, the fourth layer includes a second electrical insulator, the third layer adjoins the support structure at the first surface, and the fourth layer adjoins the support structure at the second surface.

Example 13 provides the IC device according to example 11 or 12, further including a first transistor and a second transistor, where the first layer is coupled to the first transistor and the second transistor.

Example 14 provides the IC device according to example 13, where: the first layer includes a first section of a first portion of the first electrically conductive material, a second section of a second portion of the first electrically conductive material, and a third section of a third portion of the first electrically conductive material, the first section is coupled to the first transistor, the second section is coupled to the first transistor and the second transistor, and the third section is coupled to the second transistor.

Example 15 provides the IC device according to any one of the examples 11-14, where: the conductors include a ground conductor, the ground conductor is coupled to the first layer by the via and a buried rail connected to the via, and at least a portion of the buried rail is in the support structure.

Example 16 provides the IC device according to example 15, where: the conductors further include an additional ground conductor, the additional ground conductor is coupled to the first layer by an additional via and an additional buried rail connected to the additional via, at least a portion of the additional via is in the support structure, and at least a portion of the additional buried rail is in the support structure.

Example 17 provides an IC device, including: a support structure; a first transistor over or at least partially in the support structure; a second transistor over or at least partially in the support structure; a first layer coupled to the first transistor and the second transistor, the first layer comprising a shield of a transmission line, wherein the shield comprises a first section, a second section, and a third section, wherein the first section, the second section, and the third section are separated from each other by an electrical insulator; and a second layer coupled to the first layer, the second layer comprising a first ground conductor of the transmission line, a second ground conductor of the transmission line, and a signal conductor of the transmission line, wherein the first ground conductor, the second ground conductor, and the signal conductor are separated by an electrical insulator.

Example 18 provides the IC device according to example 17, where the first ground conductor is coupled to the first section, the second ground conductor is coupled to the third section, and the second section is between the first section and the third section.

Example 19. provides the IC device according to example 17 or 18, where the first section is coupled to the first transistor, the second section is coupled to the first transistor and the second transistor, and the third section is coupled to the second transistor.

Example 20. provides the IC device according to any one of the examples 17-19, where the support structure is between the first layer and the second layer.

Example 21 provides an IC package, including the IC device according to any of the proceeding examples; and a further IC component, coupled to the IC device.

Example 22 provides the IC package according to example 21, where the further IC component includes one of a package substrate, an interposer, or a further IC die.

Example 23 provides the IC package according to example 21 or 22, where the IC device according to any one of examples 1-20 may include, or be a part of, at least one of a memory device, a computing device, a wearable device, a handheld electronic device, and a wireless communications device.

Example 24 provides a n electronic device, including a carrier substrate; and one or more of the IC devices according to any one of examples 1-20 and the IC package according to any one of examples 21-23, coupled to the carrier substrate.

Example 25 provides the electronic device according to example 24, where the carrier substrate is a motherboard.

Example 26 provides the electronic device according to example 24, where the carrier substrate is a PCB.

Example 27 provides the electronic device according to any one of examples 24-26, where the electronic device is a wearable electronic device or handheld electronic device.

Example 28 provides the electronic device according to any one of examples 24-27, where the electronic device further includes one or more communication chips and an antenna.

Example 29 provides the electronic device according to any one of examples 24-28, where the electronic device is an RF transceiver.

Example 30 provides the electronic device according to any one of examples 24-28, where the electronic device is one of a switch, a power amplifier, a low-noise amplifier, a filter, a filter bank, a duplexer, an upconverter, or a downconverter of an RF communications device, e.g., of an RF transceiver.

Example 31 provides the electronic device according to any one of examples 24-30, where the electronic device is a computing device.

Example 32 provides the electronic device according to any one of examples 24-31, where the electronic device is included in a base station of a wireless communication system.

Example 33 provides the electronic device according to any one of examples 24-31, where the electronic device is included in a user equipment device of a wireless communication system.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a support structure having a first surface and a second surface opposing the first surface;
a first transistor over or at least partially in the support structure;
a second transistor over or at least partially in the support structure;
a first layer comprising a first electrically conductive material, wherein the first layer is closer to the first surface than to the second surface, and the first layer is coupled to the first transistor and the second transistor;
a second layer comprising a second electrically conductive material and a shield of a transmission line, wherein the second layer is closer to the second surface than to the first surface, the second layer is coupled to the first layer by a first via, and at least a portion of the first via is inside the support structure, wherein the second layer has:
a first section coupled to the first transistor, the first section comprising a first portion of the second electrically conductive material,
a second section coupled to the first transistor and the second transistor, the second section comprising a second portion of the second electrically conductive material, and
a third section coupled to the second transistor, the third section comprising a third portion of the second electrically conductive material; and
a third layer comprising a third electrically conductive material and conductors of the transmission line, wherein the third layer is closer to the second surface than the first surface, the third layer is coupled to the second layer by a second via, and the second via is outside the support structure.

2. The IC device according to claim 1, wherein the first section, the second section, and the third section are separated by an electrical insulator, and the second section is between the first section and the third section.

3. The IC device according to claim 1, wherein the second layer is between the support structure and the third layer.

4. The IC device according to claim 1, wherein the conductors of the transmission line comprise a first ground conductor, a second ground conductor, and a signal conductor, and the signal conductor is between the first ground conductor and the second ground conductor.

5. The IC device according to claim 4, wherein the first ground conductor is coupled to a first section of the second layer by the second via, the second ground conductor is coupled to a second section of the second layer by a third via, and the third via outside the support structure.

6. The IC device according to claim 1, wherein the second layer is coupled to the first layer further by a buried rail in the support structure, and the buried rail is connected to the first via.

7. The IC device according to claim 1, wherein the second layer is coupled to the first layer further by a third via, the third via is outside the support structure, and the buried rail is connected to the third via.

8. The IC device according to claim 7, wherein the third via is closer to the first surface than the second surface, and the second via is closer to the second surface than the first surface.

9. The IC device according to claim 1, wherein a thickness of the third layer is larger than a thickness of the first layer.

10. An integrated circuit (IC) device, comprising:
a support structure having a first surface and a second surface opposing the first surface;
a first layer comprising a first electrically conductive material and a shield of a transmission line, wherein the first layer is closer to the first surface than the second surface; and
a second layer comprising a second electrically conductive material and conductors of the transmission line, wherein the second layer is closer to the second surface than the first surface, the second layer is coupled to the first layer by a via, at least a portion of the via is in the support structure, wherein:
the first layer comprises a first section of a first portion of the first electrically conductive material, a second section of a second portion of the first electrically conductive material, and a third section of a third portion of the first electrically conductive material,
the first section is coupled to a first transistor,
the second section is coupled to the first transistor and a second transistor, and
the third section is coupled to the second transistor.

11. The IC device according to claim 10, wherein:
the first layer is in a third layer,
the third layer includes a first electrical insulator,
the second layer is in a fourth layer,
the fourth layer includes a second electrical insulator,
the third layer adjoins the support structure at the first surface, and
the fourth layer adjoins the support structure at the second surface.

12. The IC device according to claim 10, wherein:
the conductors comprise a ground conductor,
the ground conductor is coupled to the first layer by the via and a buried rail connected to the via, and
at least a portion of the buried rail is in the support structure.

13. The IC device according to claim 12, wherein:
the conductors further comprise an additional ground conductor,
the additional ground conductor is coupled to the first layer by an additional via and an additional buried rail connected to the additional via,
at least a portion of the additional via is in the support structure, and
at least a portion of the additional buried rail is in the support structure.

14. An integrated circuit (IC) device, comprising:
a support structure;
a first transistor over or at least partially in the support structure;
a second transistor over or at least partially in the support structure;
a first layer coupled to the first transistor and the second transistor, the first layer comprising a shield of a transmission line, wherein the shield comprises a first section, a second section, and a third section, wherein the first section, the second section, and the third section are separated from each other by an electrical insulator; and
a second layer coupled to the first layer, the second layer comprising a first ground conductor of the transmission line, a second ground conductor of the transmission line, and a signal conductor of the transmission line, wherein the first ground conductor, the second ground conductor, and the signal conductor are separated by an electrical insulator,
wherein the first section is coupled to the first transistor, the second section is coupled to the first transistor and the second transistor, and the third section is coupled to the second transistor.

15. The IC device according to claim 14, wherein the first ground conductor is coupled to the first section, the second ground conductor is coupled to the third section, and the second section is between the first section and the third section.

16. The IC device according to claim 14, wherein the support structure is between the first layer and the second layer.

* * * * *

UNITED STATES PATENT AND TRADEMARK OFFICE
CERTIFICATE OF CORRECTION

| | | |
|---|---|---|
| PATENT NO. | : 12,494,410 B2 | Page 1 of 1 |
| APPLICATION NO. | : 17/550335 | |
| DATED | : December 9, 2025 | |
| INVENTOR(S) | : Carla Moran Guizan et al. | |

It is certified that error appears in the above-identified patent and that said Letters Patent is hereby corrected as shown below:

In the Claims

In Column 38, Claim 5, Line 43, delete "via" and insert -- via is --, therefor.

Signed and Sealed this
Thirteenth Day of January, 2026

John A. Squires
*Director of the United States Patent and Trademark Office*